US010791293B2

(12) United States Patent
Okura

(10) Patent No.: US 10,791,293 B2
(45) Date of Patent: Sep. 29, 2020

(54) SOLID-STATE IMAGING DEVICE, METHOD FOR DRIVING SOLID-STATE IMAGING DEVICE, AND ELECTRONIC APPARATUS

(71) Applicant: Brillnics, Inc., Grand Cayman (KY)

(72) Inventor: Shunsuke Okura, Tokyo (JP)

(73) Assignee: BRILLNICS, INC., Grand Cayman (KY)

( * ) Notice: Subject to any disclaimer, the term of this patent is extended or adjusted under 35 U.S.C. 154(b) by 0 days.

(21) Appl. No.: 16/499,843

(22) PCT Filed: Mar. 28, 2018

(86) PCT No.: PCT/JP2018/012723
§ 371 (c)(1),
(2) Date: Sep. 30, 2019

(87) PCT Pub. No.: WO2018/181463
PCT Pub. Date: Oct. 4, 2018

(65) Prior Publication Data
US 2020/0029049 A1  Jan. 23, 2020

(30) Foreign Application Priority Data
Mar. 31, 2017  (JP) .................. 2017-071682

(51) Int. Cl.
*H04N 5/3745* (2011.01)
*H01L 27/146* (2006.01)
(Continued)

(52) U.S. Cl.
CPC ... *H04N 5/37455* (2013.01); *H01L 27/14643* (2013.01); *H04N 5/3559* (2013.01); *H04N 5/378* (2013.01)

(58) Field of Classification Search
CPC .. H04N 5/37455; H04N 5/3559; H04N 5/378; H04N 5/369; H04N 5/374; H01L 27/14643
See application file for complete search history.

(56) References Cited

U.S. PATENT DOCUMENTS

2006/0158541 A1*  7/2006  Ichikawa ............. H04N 5/2355
                                                  348/308
2008/0001802 A1*  1/2008  Higuchi ................ H04N 5/357
                                                  341/155
(Continued)

FOREIGN PATENT DOCUMENTS

JP  2012-019410 A  1/2012
JP  2013-055447 A  3/2013
JP  2015-091081 A  5/2015

OTHER PUBLICATIONS

Okura et al., A 3.7 M-Pixel 1300-fps CMOS Image Sensor With 5.0 G-Pixel/s High-Speed Readout Circuit, IEEE Journal of Solid-State Circuits, Apr. 2015, pp. 1016-1024, vol. 50, No. 4.
(Continued)

*Primary Examiner* — Jason A Flohre

(57) ABSTRACT

A pixel signal includes a first pixel signal and a second pixel signal. The first pixel signal includes a read-out reset signal and a read-out luminance signal that are read out in the stated order from a pixel in a first operation, and the second pixel signal includes a read-out luminance signal and a read-out reset signal that are read out in the stated order from the pixel in a second operation. A reading circuit 40 includes an amplifying part 420 for amplifying the pixel signal, and an AD converting part 430 for analog-to-digital converting, in connection with a search signal, the pixel signal amplified by the amplifying part 420. A first search signal Vramp1 for
(Continued)

the first pixel signal and a second search signal Vramp2 for the second pixel signal are configurable such that search levels thereof are inverted.

18 Claims, 20 Drawing Sheets

(51) Int. Cl.
*H04N 5/355* (2011.01)
*H04N 5/378* (2011.01)

(56) References Cited

U.S. PATENT DOCUMENTS

| | | | |
|---|---|---|---|
| 2010/0259660 A1* | 10/2010 | Kukita | H04N 5/23241 348/308 |
| 2011/0304755 A1* | 12/2011 | Kondo | H04N 5/378 348/294 |
| 2012/0006974 A1 | 1/2012 | Egawa | |
| 2013/0057737 A1 | 3/2013 | Okura et al. | |
| 2015/0124138 A1 | 5/2015 | Ueda et al. | |
| 2018/0176493 A1* | 6/2018 | Spivak | H04N 5/378 |
| 2018/0205903 A1* | 7/2018 | Ko | H04N 5/378 |

OTHER PUBLICATIONS

Aoki et al., A Rolling-Shutter Distortion-Free 3D Stacked Image Sensor with −160dB Parasitic Light Sensitivity In-Pixel Storage Node, 2013 IEEE International Solid-State Circuits Conference, Feb. 20, 2013, pp. 482-484, Session 27, 27.3.

Patent Cooperation Treaty, International Search Report for PCT/J2018/012723, dated Jun. 12, 2018, pp. 1-2.

Patent Cooperation Treaty, International Written Opinion for PCT/J2018/012723, dated Jun. 12, 2018, pp. 1-3.

* cited by examiner

| gain [V/V] | gain_vst [V/V] | max(vrst-vsig) [V] | max(amp-vst) [V] | telesco -amp |
|---|---|---|---|---|
| 1.0 | 0.500 | 1.000 | 0.500 | off |
| 2.0 | 0.667 | 0.500 | 0.333 | off |
| 4.0 | 0.800 | 0.250 | 0.200 | on |
| 8.0 | 0.889 | 0.125 | 0.111 | on |
| 0.5 | 0.333 | 2.000 | 0.667 | off |

FIG. 17

SOLID-STATE IMAGING DEVICE, METHOD FOR DRIVING SOLID-STATE IMAGING DEVICE, AND ELECTRONIC APPARATUS

RELATED PATENT APPLICATION

This application is based on and claims the benefit of priority from International Application No. PCT/JP2018/012723, filed on Mar. 28, 2018, which claims priority to Japanese Patent Application No. 2017-071682, filed on Mar. 31, 2017, the contents of which are hereby incorporated by reference in their entirety.

TECHNICAL FIELD

The present invention relates to a solid-state imaging device, a method for driving a solid-state imaging device, and an electronic apparatus.

BACKGROUND

Solid-state imaging device (image sensors) including photoelectric conversion elements for detecting light and generating charges are embodied as CMOS (complementary metal oxide semiconductor) image sensors, which have been in practical use. The CMOS image sensors have been widely applied as parts of various types of electronic apparatuses such as digital cameras, video cameras, surveillance cameras, medical endoscopes, personal computers (PCs), mobile phones and other portable terminals (mobile devices).

The CMOS image sensor includes, for each pixel, a photodiode (a photoelectric conversion element) and a floating diffusion (FD) amplifier having a floating diffusion (FD). The mainstream design of the reading operation in the CMOS image sensor is a column parallel output processing of selecting one of the rows in the pixel array and reading the pixels in the selected row simultaneously in the column output direction.

Here, the CMOS image sensor may sequentially scan the pixels or rows one-by-one to read the charges generated by photoelectric conversion and stored in the photo-diodes. When such sequential scan is employed, in other words, an rolling shutter is employed as the electronic shutter, it is not possible to start and end the exposure for storing the charges produced by photoelectric conversion at the same time in all of the pixels. Therefore, the sequential scan has such a problem that, when a moving object is imaged, a captured image may experience distortion.

To address this problem, a global shutter is employed as the electronic shutter in a case where image distortion is not acceptable, for example, for the purposes of imaging a fast moving object and sensing that requires simultaneity among the captured images. When the global shutter is employed, the exposure can be started and ended at the same timing in all of the pixels of the pixel array part.

In a CMOS image sensor employing a global shutter as the electronic shutter, a pixel has therein a signal retaining part for retaining, in a sample-and-hold capacitor, a signal that is read out from a photoelectric conversion reading part, for example. The CMOS image sensor employing a global shutter stores the charges from the photodiodes in the sample-and-hold capacitors of the signal retaining parts at the same time in the form of voltage signals and subsequently sequentially read the voltage signals. In this way, the simultaneity is reliably achieved among the images (see, for example, Non-patent Literature 1). The CMOS image sensor of this type is provided with a bypass switch to enable the output from the photoelectric conversion reading part to bypass the signal retaining part and be transferred to a signal line, thereby having the rolling shutter function in addition to the global shutter function.

The stacked CMOS image sensor disclosed in Non-patent Literature 1 has a stacked structure in which a first substrate (a pixel die) and a second substrate (an ASIC die) are connected through microbumps (connecting parts). The first substrate has photoelectric conversion reading parts for individual pixels formed therein, and the second substrate has signal retaining parts, signal lines, a vertical scanning circuit, a horizontal scanning circuit, a column reading circuit and the like for the individual pixels formed therein.

Non-patent Literature 2 discloses an example configuration of a column reading circuit for a CMOS image sensor (FIG. 5). The column reading circuit is configured to provide the rolling shutter function and includes a column amplifier, a correlated double sampling (CDS) circuit and an analog-to-digital converter (ADC).

RELEVANT REFERENCES

List of Relevant Non-Patent Literature

[Non-patent Literature 1] J. Aoki, et al., "A Rolling-Shutter Distortion-Free 3D Stacked Image Sensor with −160 dB Parasitic Light Sensitivity In-Pixel Storage Node" ISSCC 2013/SESSION 27/IMAGE SENSORS/27.3.

[Non-patent literature 2] S. Okura, et al., "A 3.7 M-Pixel 1300-fps CMOS Image Sensor With 5.0 G-Pixel/s High-Speed Readout Circuit," in IEEE Journal of Solid-State Circuits, vol. 50, no. 4. pp. 1016-1024, April 2015.

SUMMARY

A conventional CMOS image sensor having both a rolling shutter function and a global shutter function has the following problem. The column reading circuit is required to have separate capacitors for retaining the reset level and the signal level of the pixel output and to organize different pixel output signals for the different functions for the processing by the ADC. The area occupied by the capacitors and the power consumed to drive the capacitors pose a problem.

When the CMOS image sensor is in the rolling shutter mode, a read-out reset signal and a read-out luminance signal are read out in the stated order from the pixels and processed in the column reading circuit. When the CMOS image sensor is in the global shutter mode, on the other hand, the read-out luminance signal and the read-out reset signal are read out in the stated order from the pixels and processed in the column reading circuit. Therefore, at present, the rolling shutter function and the global shutter function inevitably require column reading circuits of different configurations.

For the above reasons, a CMOS image sensor having a rolling shutter function and another CMOS image sensor having a global shutter function have difficulties in sharing the same column reading circuit. Likewise, a CMOS image sensor having both a rolling shutter function and a global shutter function has difficulties in using a single column reading circuit and thus requires separate column reading circuits for the respective modes. This results in disadvantages such as increased circuit scale and more complicated control.

The read-out signals to be read out from the pixels may be single-ended, differential or other types of signals. To address this issue, it is also necessary to provide separate column reading circuits for the respective signal types, which similarly results in disadvantages such as increased circuit scale and more complicated control.

The objective of the present invention is to provide a solid-state imaging device, a method for driving a solid-state imaging device and an electronic apparatus that are capable of using a same reading circuit for different operational modes and read-out signals of different signal types, which can eventually realize reduced circuit scale, less complicated control and lower power consumption.

A first aspect of the present invention provides a solid-state imaging device including: a pixel part having a pixel arranged therein, where the pixel performs photoelectric conversion; and a reading circuit having an analog-to-digital (AD) conversion function for analog-to-digital converting a pixel signal read out from the pixel to a signal line. The pixel signal read out from the pixel is at least either one of: a first pixel signal including a read-out reset signal and a read-out luminance signal that are read out in the stated order from the pixel in a first operation; and a second pixel signal including a read-out luminance signal and a read-out reset signal that are read out in the stated order from the pixel in a second operation. The reading circuit includes: an amplifying part for amplifying the pixel signal; and an AD converting part for analog-to-digital converting, in connection with a search signal, the pixel signal amplified by the amplifying part. A first search signal for the first pixel signal and a second search signal for the second pixel signal are configurable such that search levels thereof are inverted.

A second aspect of the present invention provides a method for driving a solid-state imaging device. The solid-state imaging device includes: a pixel part having a pixel arranged therein, where the pixel performs photoelectric conversion; and a reading circuit having an analog-to-digital (AD) conversion function for analog-to-digital converting a pixel signal read out from the pixel to a signal line. The reading circuit includes: an amplifying part for amplifying the pixel signal; and an AD converting part for analog-to-digital converting, in connection with a search signal, the pixel signal amplified by the amplifying part. The pixel signal read out from the pixel is at least either one of: a first pixel signal including a read-out reset signal and a read-out luminance signal that are read out in the stated order from the pixel in a first operation; and a second pixel signal including a read-out luminance signal and a read-out reset signal that are read out in the stated order from the pixel in a second operation. The search signal fed to the reading circuit is configured such that a first search signal for the first pixel signal and a second search signal for the second pixel signal are configurable such that search levels thereof are inverted.

A third aspect of the present invention provides an electronic apparatus including: a solid-state imaging device; and an optical system for forming a subject image on the solid-state imaging device. The solid-state imaging device includes: a pixel part having a pixel arranged therein, where the pixel performs photoelectric conversion; and a reading circuit having an analog-to-digital (AD) conversion function for analog-to-digital converting a pixel signal read out from the pixel to a signal line. The pixel signal read out from the pixel is at least either one of: a first pixel signal including a read-out reset signal and a read-out luminance signal that are read out in the stated order from the pixel in a first operation; and a second pixel signal including a read-out luminance signal and a read-out reset signal that are read out in the stated order from the pixel in a second operation. The reading circuit includes: an amplifying part for amplifying the pixel signal; and an AD converting part for analog-to-digital converting, in connection with a search signal, the pixel signal amplified by the amplifying part. A first search signal for the first pixel signal and a second search signal for the second pixel signal are configurable such that search levels thereof are inverted.

Advantages

The present invention makes it possible to use a same reading circuit for different operational modes and read-out signals of different signal types, which can eventually realize reduced circuit scale, less complicated control and lower power consumption.

BRIEF DESCRIPTION OF THE DRAWINGS

FIG. 17 is used to illustrate an example of how to control the input range of the first operational amplifier in a differential global shutter mode.

DESCRIPTION OF THE EMBODIMENTS

Embodiments of the present invention will be hereinafter described with reference to the drawings.

First Embodiment

Figure 1:
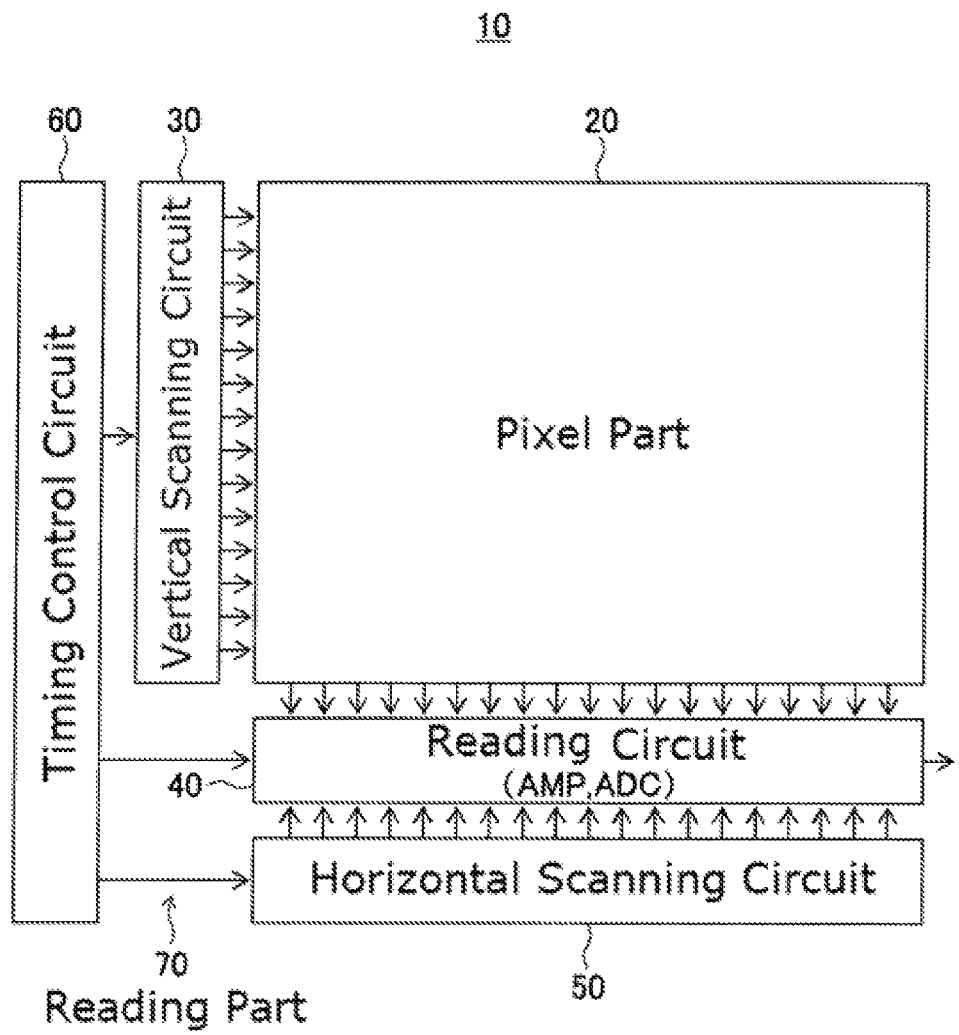
FIG. 1 is a block diagram showing an example configuration of a solid-state imaging device relating to a first embodiment of the present invention.

FIG. 1 is a block diagram showing an example configuration of a solid-state imaging device according to a first embodiment of the present invention. In this embodiment, the solid-state imaging device 10 is constituted by, for example, a CMOS image sensor.

As shown in FIG. 1, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60. Among these components, for example, the vertical scanning circuit 30, the reading circuit 40, the horizontal scanning circuit 50, and the timing control circuit 60 constitute the reading part 70 for reading out pixel signals.

In the first embodiment, the pixels constituting the pixel part 20 of the solid-state imaging device 10 include a first pixel that includes a photoelectric conversion reading part and a signal retaining part and a second pixel that includes a photoelectric conversion reading part, as will be described in detail below. With such configuration, the solid-state imaging device 10 is configured, for example, as a stacked CMOS image sensor capable of operating in both of a rolling shutter mode or a first operation and a global shutter mode or a second operation. In the solid-state imaging device 10 relating to the first embodiment, the pixel part 20 includes a first pixel array in which photoelectric conversion reading parts of a plurality of first pixels are arranged in a matrix pattern, a retaining part array in which the signal retaining parts of the plurality of first pixels are arranged in a matrix pattern, and a second pixel array in which the photoelectric conversion reading parts of a plurality of second pixels are arranged in a matrix pattern. In the rolling shutter mode or first operation, the read-out signals of the photoelectric conversion reading parts of the first and second pixels are directly output to first vertical signal lines without traveling through bypass paths. In the global shutter mode or second operation, the retaining signals of the signal retaining parts of the first pixels are output to second vertical signal lines.

The column reading circuit 40 then amplifies and AD converts the pixel read-out signals transmitted through the first or second vertical signal lines. In the solid-state imaging device 10 relating to the first embodiment, the column reading circuit 40 is configured such that the single circuit configuration can be compatible with any operational modes and read-out signals of any signal types (whether the read-out signals are single-ended, differential or the like), as will be described in detail below.

The following outlines the configurations and functions of the parts of the solid-state imaging device 10. In particular, the configurations and functions of the pixel part 20 and the column reading circuit 40 and the relating reading operation will be described in detail, and the stacked structure of the pixel part 20 and the reading part 70 and other features will be also described in detail.

(The Configurations of the First and Second Pixels and the Pixel Part 20)

Figure 2:
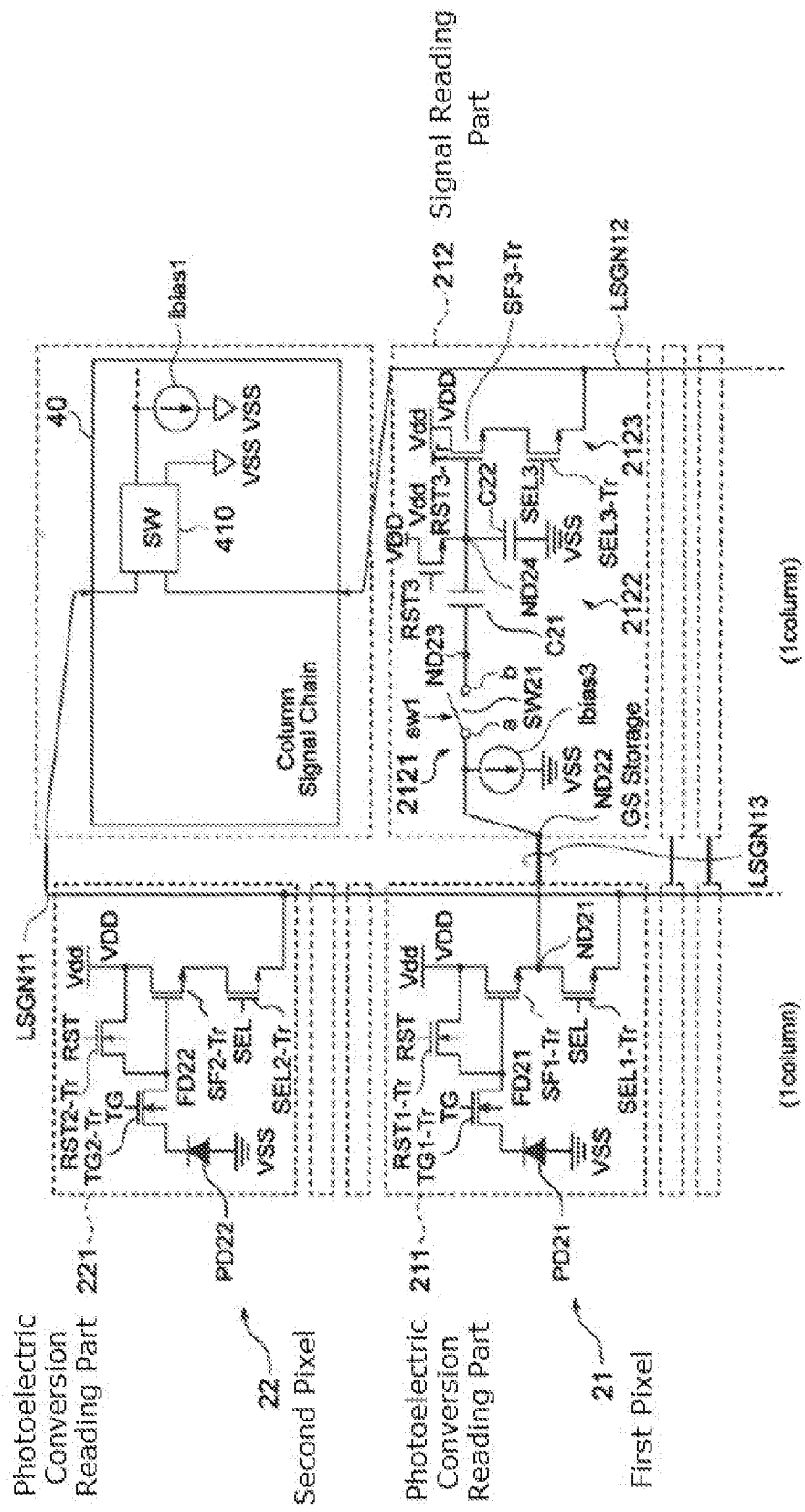
FIG. 2 is a circuit diagram showing, as one example, a first pixel and a second pixel of the solid-state imaging device relating to the first embodiment of the present invention.

FIG. 2 is a circuit diagram showing, as one example, the first and second pixels of the solid-state imaging device 10 relating to the first embodiment of the present invention.

The first pixel 21 arranged in the pixel part 20 includes a photoelectric conversion reading part 211 and a signal retaining part 212. The second pixel 22 arranged in the pixel part 20 includes a photoelectric conversion part 221.

The photoelectric conversion reading part 211 of the first pixel 21 includes a photodiode (a photoelectric conversion element) and an in-pixel amplifier. More specifically, the photoelectric conversion reading part 211 includes, for example, a photodiode PD21 serving as a photoelectric converting part. For the photodiode PD21, one transfer transistor TG1-Tr serving as a transferring element, one reset transistor RST1-Tr serving as a resetting element, one source follower transistor SF1-Tr serving as a source follower element, and one output node ND21, and a selection transistor SEL1-Tr serving as a selecting element (a selection switch) are provided. As described above, the photoelectric conversion reading part 211 of the first pixel 21 relating to the first embodiment includes four transistors (4Tr), namely, the transfer transistor TG1-Tr, the reset transistor RST1-Tr, the source follower transistor SF1-Tr, and the selection transistor SEL1-Tr.

The photoelectric conversion reading part 211 relating to the first embodiment is connected at an output node ND21 thereof to the input part of the signal retaining part 212 of the first pixel 21 and through the selection transistor SEL1-Tr to the first vertical signal line LSGN11. In the rolling shutter mode, the photoelectric conversion reading part 211 outputs a first pixel signal pixout1, which includes a read-out reset signal (signal voltage) (VRST1) and a read-out luminance signal (signal voltage) (VSIG1), to the first vertical signal line LSGN11. In the global shutter mode, the photoelectric conversion reading part 211 outputs a second pixel signal pixout2, which includes a read-out luminance signal (signal voltage) (VSIG1) and a read-out reset signal (signal voltage) (VRST1), to the signal retaining part 212.

In the first embodiment, the first vertical signal line LSGN11 is driven by a constant current source Ibias1 in the rolling shutter mode, and the second vertical signal line LSGN12 is driven by the constant current source Ibias1 in the global shutter mode. The constant current source Ibias1 is used both in the rolling shutter mode and in the global shutter mode. As shown in FIG. 2, a switching part 410 switches the connection target to which the constant current source Ibias1 is connected depending on the operational mode. In the rolling shutter mode, the first vertical signal line LSGN11 is connected to the constant current source Ibias1, and the second vertical signal line LSGN12 is connected to a reference potential VSS (for example, the ground). In the global shutter mode, on the other hand, the second vertical signal line LSGN12 is connected to the constant current source Ibias1, and the first vertical signal line LSGN11 is connected to the reference potential VSS (for example, the ground).

The photodiode PD21 generates signal charges (electrons) in an amount determined by the quantity of the incident light and stores the same. Description will be hereinafter given of a case where the signal charges are electrons and each transistor is an n-type transistor. However, it is also possible that the signal charges are holes or each transistor is a p-type transistor. Further, this embodiment is also applicable to the case where a plurality of photodiodes and transfer transistors share the transistors.

The transfer transistor TG1-Tr of the photoelectric conversion reading part 211 is connected between the photodiode PD21 and the floating diffusion FD21 and controlled by a control signal TG applied to the gate thereof through a control line. The transfer transistor TG1-Tr remains selected and in the conduction state during a transfer period in which the control signal TG is high (H) level, to transfer to the floating diffusion FD21 the charges (electrons) produced by the photoelectric conversion and then stored in the photodiode PD21.

The reset transistor RST1-Tr is connected between a power supply line Vdd of power supply voltage VDD and the floating diffusion FD21 and controlled by a control signal RST applied to the gate thereof through a control line. The reset transistor RST1-Tr remains selected and in the conduction state during a reset period in which the control signal RST is at the H level, to reset the floating diffusion FD21 to the potential of the power supply line Vdd of the power supply voltage VDD.

The source follower transistor SF1-Tr and the selection transistor SEL1-Tr are connected in series between the power supply line Vdd and the first vertical signal line LSGN11, which is to be driven by the constant current source Ibias1. The output node ND21 is formed by the connection point between the source of the source follower transistor SF1-Tr and the drain of the selection transistor SEL1-Tr. A signal line LSGN13 between the output node ND21 and the input part of the signal retaining part 212 is driven by a constant current source Ibias3, which is, for example, arranged in the input part of the signal retaining part 212. The source follower transistor SF1-Tr outputs, to the output node ND21, a column output generated by converting the charges in the floating diffusion FD21 to a voltage signal determined by the quantity of the charges. The column output includes a read-out reset signal (VRST1) and a read-out luminance signal (VSIG1), or a read-out luminance signal (VSIG1) and a read-out reset signal (VRST1).

The gate of the source follower transistor SF1-Tr is connected to the floating diffusion FD 2 1, and the selection transistor SEL1-Tr is controlled by a control signal SEL applied to the gate thereof through a control line. The selection transistor SEL1-Tr remains selected and in the conduction state during a selection period in which the control signal SEL is at the H level. In this way, the source follower transistor SF1-Tr outputs, to the first vertical signal line LSGN11, a read-out reset signal (VRST1) and a read-out luminance signal (VSIG1) generated by converting the charges of the floating diffusion FD21 to a voltage signal determined by the quantity of the charges.

The signal retaining part 212 of the first pixel 21 basically includes an input part 2121 connected to the constant current source Ibias3, a sample holding part 2122, an output part 2123, and nodes ND22 to ND24.

The constant current source Ibias3 is connected between the node ND22 and the reference potential VSS and controlled to remain on during a predetermined period of time in a global shutter period, for example.

In place of the constant current source Ibias3, a switch element may be provided, which is connected between the node ND22 and the reference potential VSS and controlled to remain on during a predetermined period of time in a global shutter period, for example.

The sample holding part 2122 includes a switch element SW21 that may selectively connects the sample-and-hold capacitors of the sample holding part 2122 to the output node ND21 of the photoelectric conversion reading part 211 during a global shutter period or second period, sample-and-hold capacitors C21, C22 that are capable of retaining the signal output from the output node ND21 of the photoelectric conversion reading part 211 of the first pixel 21, and a reset transistor RST3-Tr that may reset the node ND24. A terminal a of the switch element SW21 is connected to the input node ND22, which is connected to the third signal line LSGN13, and a terminal b of the switch element SW21 is connected to a node ND23, which is connected to the sample holding part 2122. For example, while the signal sw1 is at the high level, the terminals a and b of the switch element SW21 are connected so that the switch element SW21 is in the conduction state. The sample-and-hold capacitor C21 is connected between the node ND23 and the node ND24. The sample-and-hold capacitor C22 is connected between the node ND24 and the reference potential VSS.

The reset transistor RST3-Tr is connected between the power supply line Vdd of the power supply voltage VDD and the node ND24 and controlled by the control signal RST3 applied to the gate thereof through the control line. The reset transistor RST3-Tr remains selected and in the conduction state during a reset period in which the control signal RST3 is at the H level and resets the node ND24 (and the capacitors C21, C22) to the potential of the power supply line Vdd of the power supply voltage VDD.

The output part 2123 includes a source follower transistor SF3-Tr for outputting the signals retained in the sample-and-hold capacitors C21, C22 in accordance with the retained voltage in a global shutter period or second period, and selectively outputs the retained signals through the selection transistor SEL3-Tr to the second vertical signal line LSGN12, which is to be driven by the constant current source Ibias1.

The source follower transistor SF3-Tr and the selection transistor SEL3-Tr are connected in series between the power supply line Vdd and the second vertical signal line LSGN12, which is to be driven by the constant current source Ibias1.

The gate of the source follower transistor SF3-Tr is connected to the node ND24, and the selection transistor SEL3-Tr is controlled by a control signal SEL3 applied to the gate thereof through a control line. The selection transistor SEL3-Tr remains selected and in the conduction state during a selection period in which the control signal SEL3 is at the H level. In this way, the source follower transistor SF3-Tr outputs, to the second vertical signal line LSGN12, read-out voltages (VRST, VSIG) of a column output corresponding to the voltages retained in the sample-and-hold capacitors C21, C22.

The above describes only one example of the configuration of the signal retaining part 212, and the signal retaining part 212 can include a circuit of any configuration as long as the signal retaining part 212 can retain, during a global shutter period or second period, the read-out luminance signal (VSIG1) and the read-out reset signal (VRST1) output from the above-described photoelectric conversion reading part 211.

The second pixel 22 arranged in the pixel part 20 includes a photoelectric conversion reading part 221. The photoelectric conversion reading part 221 of the second pixel 22 has the same configuration as the photoelectric conversion reading part 211 of the first pixel 21 described above.

In other words, the photoelectric conversion reading part 221 of the second pixel 22 includes a photodiode (photoelectric conversion element) and an in-pixel amplifier. More specifically, the photoelectric conversion reading part 221 includes, for example, a photodiode PD22 serving as a photoelectric conversion part. For the photodiode PD22, the photoelectric conversion reading part 221 includes one transfer transistor TG2-Tr serving as a transferring element, one reset transistor RST2-Tr serving as a resetting element, one source follower transistor SF2-Tr serving as a source follower element, and one selection transistor SEL2-Tr serving as a selecting element (selection switch). As described above, the photoelectric conversion reading part 221 of the second pixel 22 relating to the first embodiment includes four transistors (4Tr), namely, the transfer transistor TG2-Tr, the reset transistor RST2-Tr, the source follower transistor SF2-Tr, and the selection transistor SEL2-Tr.

In the rolling shutter mode, the photoelectric conversion reading part 221 relating to the first embodiment outputs a read-out reset signal (signal voltage) (VRST2) and a read-out luminance signal (signal voltage) (VSIG2), to the first vertical signal line LSGN11.

The photodiode PD22 generates signal charges (electrons) in an amount determined by the quantity of the incident light and stores the same. Description will be given of a case where the signal charges are electrons and each transistor is an n-type transistor. However, it is also possible that the signal charges are holes or each transistor is a p-type transistor. Further, this embodiment is also applicable to the case where a plurality of photodiodes and transfer transistors share the transistors.

The transfer transistor TG2-Tr of the photoelectric conversion reading part 221 is connected between the photodiode PD22 and the floating diffusion FD22 and controlled by a control signal TG applied to the gate thereof through a control line. The transfer transistor TG2-Tr remains selected and in the conduction state during a transfer period in which the control signal TG is at the H level, to transfer to the floating diffusion FD22 the charges (electrons) produced by the photoelectric conversion and then stored in the photodiode PD22.

The reset transistor RST2-Tr is connected between the power supply line Vdd of the power supply voltage VDD and the floating diffusion FD22 and controlled by the control signal RST applied to the gate thereof through a control line. The reset transistor RST2-Tr remains selected and in the conduction state during a reset period in which the control signal RST is at the H level, to reset the floating diffusion FD22 to the potential of the power supply line Vdd of the power supply voltage VDD.

The source follower transistor SF2-Tr and the selection transistor SEL2-Tr are connected in series between the power supply line Vdd and the first vertical signal line LSGN11, which is to be driven by the constant current source Ibias1.

The gate of the source follower transistor SF2-Tr is connected to the floating diffusion FD 2 2, and the selection transistor SEL2-Tr is controlled by the control signal SEL applied to the gate thereof through a control line. The selection transistor SEL2-Tr remains selected and in the conduction state during a selection period in which the control signal SEL is at the H level. In this way, the source follower transistor SF2-Tr outputs, to the first vertical signal line LSGN11, a read-out reset signal (VRST2) and a read-out luminance signal (VSIG2) of a column output obtained by converting the charges in the floating diffusion FD22 into a voltage signal determined by the quantity of the charges.

Figure 3:
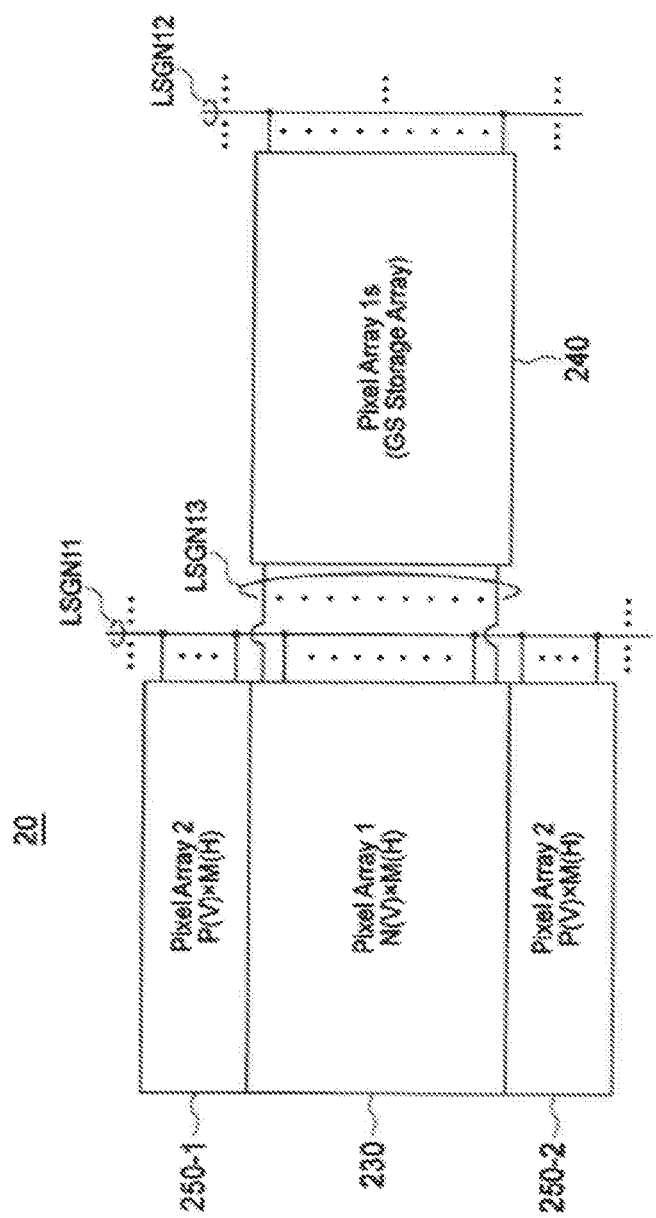
FIG. 3 is used to illustrate a pixel array in a pixel part of the solid-state imaging device relating to the first embodiment of the present invention.

In the pixel part 20 relating to the first embodiment, the first and second pixels 22 having the above-described configurations are arranged to form a pixel array, for example, as shown in FIG. 3, and a plurality of pixel arrays are combined.

FIG. 3 is used to illustrate the pixel arrays in the pixel part 20 of the solid-state imaging device 10 relating to the first embodiment of the present invention.

The pixel part 20 of the solid-state imaging device 10 relating to the first embodiment includes a first pixel array 230, a retaining part array 240, an upper second pixel array 250-1 and a lower second pixel array 250-2.

In the first pixel array 230, photoelectric conversion reading parts 211 of a plurality of first pixels 21 are arranged in a two-dimensional matrix of N rows and M columns. In the first pixel array 230, the photoelectric conversion reading parts 211 of the plurality of first pixels 21 are arranged in a two-dimensional matrix of N rows and M columns, such that an image having an aspect ratio of 16:9 can be output, for example.

In the retaining part array 240, signal retaining parts 212 of the plurality of first pixels 21 are arranged in a two-dimensional matrix of N rows and M columns, correspondingly to the first pixel array 230. As in the first pixel array 230, in the retaining part array 240, the signal retaining parts 212 of the plurality of first pixels 21 are arranged in a two-dimensional matrix of N rows and M columns, such that an image having an aspect ratio of 16:9 can be output, for example.

In the upper second pixel array 250-1, photoelectric conversion reading parts 221 of a plurality of second pixels 22 are arranged in a two-dimensional matrix of P (P<N) rows and M columns.

Likewise, in the lower second pixel array 250-2, photoelectric conversion reading parts 221 of the plurality of second pixels 22 are arranged in a two-dimensional matrix of P (P<N) rows and M columns.

Referring to the example shown in FIG. 3, the second pixel arrays 250-1, 250-2 are arranged on both (upper and lower) sides of the first pixel array 230 in the extending direction of the first vertical signal line LSGN11. Note that the second pixel array 250 may be arranged at least one of the sides of the first pixel array 230 in the extending direction of the first vertical signal line LSGN11.

In the second pixel arrays 250-1, 250-2, the photoelectric conversion reading parts 221 of the plurality of second pixels 22 are arranged in a two-dimensional matrix of P (P<N) rows and M columns, such that, in the rolling shutter mode, the second pixel arrays 250-1, 250-2 are activated, together with the first pixel array 230, to output an image having an aspect ratio of, for example, 1:1 as a whole. The above-mentioned aspect ratio may be any ratio, for example, 4:3.

Note that, in the rolling shutter mode, the first pixel array 230 may be used as the region for electronic image stabilization, and an image having an aspect ratio of 16:9 may be output.

Here, the photoelectric conversion reading parts 211 in the same column in the first pixel array 230 and the second pixel arrays 250-1, 250-2 are connected to a common first vertical signal line LSGN11.

When the solid-state imaging device 10 has a stacked structure made up by a first substrate (an upper substrate) and a second substrate (a lower substrate) as will be described below, the first pixel array 230 and the second pixel arrays 250-1, 250-2 are formed in the first substrate, and the retaining part array 240 is formed in the second substrate so as to face the first pixel array 230.

In the rolling shutter mode or first operation, in the pixel part 20 under the control of the reading part 70, the first pixel array 230 and the second pixel arrays 250-1, 250-2 are activated so that the pixels are sequentially accessed and the pixel signals are read out in a row-by-row manner.

In addition, in the global shutter mode or second operation, in the pixel part 20 under the control of the reading part 70, the first pixel array 230 and the retaining part array 240 are activated so that the pixel signals are read out with the selection transistors SEL1-Tr, SEL2-Tr being in the non-selected state (the signal SEL being at the low level) in the photoelectric conversion reading parts 221 of the first pixel array 230 and the second pixel arrays 250-1 and 250-2.

In the pixel part 20, the pixel signals are read out simultaneously in parallel from the pixels in each row since, for example, the gates of the transfer transistors TG-Tr, reset transistors RST-Tr, and selection transistors SEL-Tr in each row are connected to each other.

Since the pixel part 20 includes the pixels arranged in (N+2P) rows and M columns, the numbers of the control lines LSEL, LRST, LTG are each (N+2P) and the numbers of the first and second vertical signal lines LSGN11 and LSGN12 are each M.

The vertical scanning circuit 30 drives the photoelectric conversion reading parts 211 and the signal retaining parts 212 of the first pixels 21 and the photoelectric conversion reading parts 221 of the second pixels 22 through row-scanning control lines in shutter and reading rows, under the control of the timing control circuit 60. Further, the vertical scanning circuit 30 outputs, according to an address signal, row selection signals indicating the row addresses of the reading row from which signals are to be read out and the shutter row in which the charges stored in the photodiodes PD are to be reset.

The column reading circuit 40 includes a plurality of column signal processing circuits (not shown) arranged so as to correspond to the column outputs from the pixel part 20, and the column reading circuit 40 may be configured such that the plurality of column signal processing circuits are capable of processing the columns in parallel. The column reading circuit 40 amplifies and AD converts, in the rolling shutter mode or first operation, first pixel signals pixout1 (VSL1) that are read out from the photoelectric conversion reading parts 211 of the first pixels 21 and the photoelectric conversion reading parts 221 of the second pixels 22 to the first vertical signal lines LSGN 11 and, in the global shutter mode or the second operation, second pixel signals pixout2 (VSL2) that are read out from the signal retaining parts 212 of the first pixels 21 to the second vertical signal lines LSGN12.

Here, the first pixel signal pixout1 (VSL1) denotes a pixel read-out signal including a read-out reset signal VRST and a read-out luminance signal VSIG that are sequentially read out from the pixel (in the present example, the photoelectric conversion reading part 211 of the first pixel 21 and the photoelectric conversion reading part 221 of the second pixel 22) in the rolling shutter mode or the first operation. The second pixel signal pixout2 (VSL2) denotes a pixel read-out signal including a read-out luminance signal VSIG and a read-out reset signal VRST that are sequentially read out from the pixel (in the present example, the photoelectric conversion reading part 211 and the signal retaining part 212 of the first pixel 21) in the global shutter mode or second operation.

In the solid-state imaging device 10 relating to the first embodiment, the column reading circuit 40 is configured such that the single circuit configuration can be used in any operational modes and for read-out signals of any signal types (single-ended or differential read-out signals).

Figure 4:
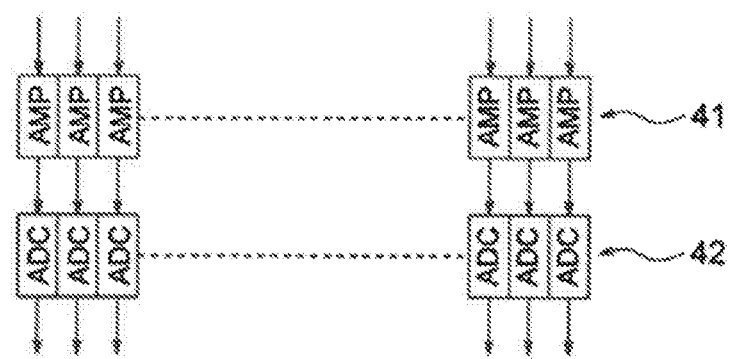
FIG. 4 is used to illustrate an example configuration of a column output reading system in a pixel part of a solid-state imaging device relating to an embodiment of the present invention.
Figure 5:
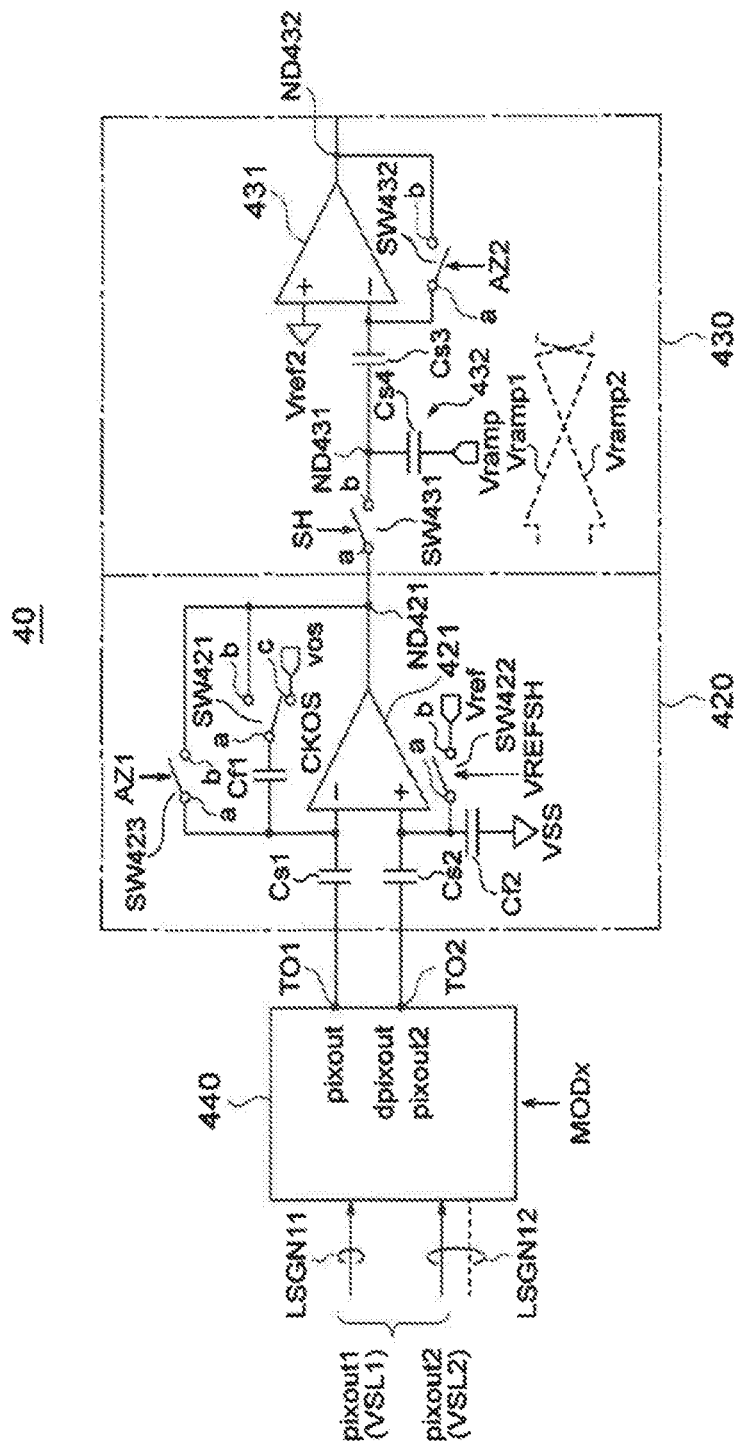
FIG. 5 is a circuit diagram showing an example configuration of a column reading circuit of the solid-state imaging device relating to the first embodiment of the present invention.

The column reading circuit 40 includes an amplifier (AMP) 41 and an ADC 42 as shown in FIG. 4, for example. With reference to FIG. 5, the column reading circuit 40 is constituted by an amplifying part 420 for amplifying the first pixel signal pixout1 (VSL1) and the second pixel signal pixout2 (VSL2) and an AD converting part 430 including an ADC for converting, into digital signals, the analog read-out signals VSL1, VSL2 of each column output of the pixel part 20 that have been amplified by the amplifying part 420.

In the first embodiment, the column reading circuit 40 includes a circuit for selecting one of the signal transmitted through the first vertical signal line LSGN11 and the signal transmitted through the second vertical signal line LSGN12 depending on the operational mode and inputting the selected signal into the column signal processing circuit of each column.

FIG. 5 is a circuit diagram showing an example configuration of the column reading circuit of the solid-state imaging device relating to the first embodiment of the present invention.

As shown in FIG. 5, the column reading circuit 40 is configured such that the amplifying part 420 for amplifying the first pixel signal pixout1 (VSL1) and the second pixel signal pixout2 (VSL2) is cascade-connected to the AD converting part 430 for converting the analog pixel signal that has been amplified by the amplifying part 420, into a digital signal in connection with a search signal (for example, Vramp). The column reading circuit 40 additionally includes, in the input stage, an input part 440 for selecting one of the pixel read-out signals pixout based on the mode signal MODx (x=1, 2, 3, 4, . . . ) and inputting the selected pixel read-out signal into the two input terminals of the operational amplifier arranged in the amplifying part 420.

The amplifying part 420 includes a first operational amplifier (hereinafter, referred to as the opamp) 421, a first sampling capacitor (input capacitor) Cs1, a first feedback capacitor Cf1, a second sampling capacitor Cs2, a second feedback capacitor Cf2, a first switch part SW421, a second switch part SW422, a first autozero switch part SW423, an output node ND 421, an offset potential VOS, and a referential potential Vref.

The first opamp 421 includes two input terminals, namely, a first input terminal, which is an inversion input terminal (−) in the present embodiment, and a second input terminal, which is a non-inversion input terminal (+) in the present embodiment. The first opamp 421 multiplies (amplifies) the difference between the input voltage Vin1 input into the first input terminal (−) and the input voltage Vin2 input into the second input terminal (+) by a gain or AO to obtain an amplified output ampout. If the gain (AO) is sufficiently high, the first input terminal (−) and the second input terminal (+) are virtually grounded when a negative feedback circuit including the first switch part SW421 or first autozero switch part SW423 is constituted. The output terminal of the first opamp 421 is connected to the output node ND421.

The first sampling capacitor Cs1 is connected between (i) a first output terminal TO1 of the input part 440, which serves as the input line end of the first or second pixel signal, and (ii) the first input terminal (−) of the first opamp 421.

The second sampling capacitor Cs2 is connected between (i) a second output terminal TO2 of the input part 440, which serves as the input line end of the first or second pixel signal, and (ii) the second input terminal (+) of the first opamp 421.

The first output terminal TO1 of the input part 440 feeds one of the following pixel signals (signal voltages), which is determined based on the four mode signals MOD1 to MOD4. In the case of the first mode signal MOD1, a single-ended first pixel signal pixout1 obtained in the rolling shutter mode is fed from the first output terminal TO1 of the input part 440. In the case of the second mode signal MOD2, a single-ended second pixel signal pixout2 obtained in the global shutter mode is fed from the first output terminal TO1 of the input part 440. In the case of the third mode signal MOD3, a first pixel signal pixout1$d$1, which is one of the differential signals obtained in the differential rolling shutter mode, is fed from the first output terminal TO1 of the input part 440. In the case of the fourth mode signal MOD4, a second pixel signal pixout2$d$1, which is one of the differential signals obtained in the differential global shutter mode, is fed from the first output terminal TO1 of the input part 440.

The second output terminal TO2 of the input part 440 feeds one of the following pixel signals (signal voltages), which is determined based on the four mode signals MOD1 to MOD4. In the case of the first mode signal MOD1, no pixel signal is fed from the second output terminal TO2 of the input part 440. In the case of the second mode signal MOD2, no pixel signal is fed from the second output terminal TO2 of the input part 440. In the case of the third mode signal MOD3, a first pixel signal pixout1$d$2, which is the other of the differential signals obtained in the differential rolling shutter mode, is fed from the second output terminal TO2 of the input part 440. In the case of the fourth mode signal MOD4, a second pixel signal pixout2$d$2, which is the other of the differential signals obtained in the differential global shutter mode, is fed from the second output terminal TO2 of the input part 440.

The first feedback capacitor Cf1 is connected at one of the electrode ends thereof to the first input terminal (−) of the first opamp 421 and at the other electrode end thereof to the first switch part SW421.

The second feedback capacitor Cf2 is connected at one of the electrode ends thereof to the second input terminal (+) of the first opamp 421 and at the other electrode end thereof to the reference potential VSS (for example, the ground GND).

The first switch part SW421 is connected at a terminal a thereof to the other electrode end of the first sampling capacitor Cf1, at a terminal b thereof to the output node ND421 (the output terminal of the first opamp 421) and at a terminal c thereof to an offset potential VOS. In the first switch part SW421, the terminals a and b are connected when the control signal CKOS is at the low level (L), and the terminals a and c are connected when the control signal CKOS is at the high level (H), for example.

In the present embodiment, the control signal CKOS is fed at the L level when the mode signal fed to the input part 440 is one of the first mode signal MOD1 (the single-ended rolling shutter mode), the third mode signal MOD3 (the differential rolling shutter mode) and the fourth mode signal MOD 4 (the differential global shutter mode) and is fed as a clock when the mode signal fed to the input part 440 is the second mode signal MOD2 (the single-ended global shutter mode). In other words, the first feedback capacitor Cf1 is connected between the first input terminal (−) of the first opamp 421 and the output node ND421 when the mode signal fed to the input part 440 is one of the first mode signal MOD1 (the single-ended rolling shutter mode), the third mode signal MOD3 (the differential rolling shutter mode) and the fourth mode signal MOD 4 (the differential global shutter mode). The first feedback capacitor Cf1 transits between (i) the state in which the first feedback capacitor Cf1 is connected between the first input terminal (−) of the first opamp 421 and the output node ND421 and (ii) the state in which the first feedback capacitor Cf1 is connected between the first input terminal (−) of the first opamp 421 and the offset potential VOS, when the mode signal fed to the input part 440 is the second mode signal MOD2 (the single-ended global shutter mode).

In the first embodiment, the offset potential VOS is set to be higher than the referential potential Vref by the voltage Vfs (VOS=Vref+Vfs).

The second switch part SW422 is connected at a terminal a thereof to the second input terminal (+) of the first opamp 421 and at a terminal b thereof to the referential potential Vref. When the control signal VREFSH is fed as a clock to the second switch part SW422, the conduction state (ON state) is maintained between the terminals a and b while the clock is at the H level and the non-conduction state (OFF state) is maintained between the terminals a and b while the clock is at the L level. The second switch part SW422 remains in the conduction state (ON state) between the terminals a and b when the mode signal fed to the input part 440 is one of the first mode signal MOD1 (the single-ended rolling shutter mode) and the second mode signal MOD2 (the single-ended global shutter mode) and transits between the conduction state (ON state) and the non-conduction state (OFF state) when the mode signal fed to the input part 440 is one of the third mode signal MOD3 (the differential rolling shutter mode) and the fourth mode signal MOD4 (the differential global shutter mode).

The autozero switch part SW423 is connected at a terminal a thereof to the first input terminal (−) of the first opamp 421 and at a terminal b thereof to the output node ND421 (the output terminal of the first opamp 421). The autozero switch part SW423 remains in the conduction state (ON state) between the terminals a and b when the control signal AZ1 is at the H level and remains in the non-conduction state (OFF state) between the terminals a and b when the control signal AZ1 is at the L level. The first opamp 421 is reset when the autozero switch part SW423 is in the conduction state.

The AD converting part 430 includes a second opamp 431, a search signal input part 432, a sample holding switch part SW431, a third sampling capacitor Cs3, a second autozero switch part SW432, an input node ND431 and an output node ND432.

The second opamp 431 has two input terminals, namely, a first input terminal, which is an inversion input terminal (−) in the present embodiment, and a second input terminal, which is a non-inversion input terminal (+) in the present embodiment. During AD conversion, input signal voltage Vcmp fed into the first input terminal (−) of the second opamp 431 is signal voltage obtained by combining together the voltage retained in the third sampling capacitor Cs3, the voltage retained in the fourth sampling capacitor Cs4 and the search signal Vramp provided by the search signal input part 432.

Here, the search signal Vramp linearly changes at a certain gradient and is a signal having a slope waveform. In the present example, the search signal Vramp is fed as a signal having a negative slope waveform in which the level is high on the left side and low on the right side, for example, a first search signal Vramp1 shown in FIG. 5. As an alternative, in the present example, the search signal Vramp is fed as a signal having a positive slope waveform in which the level is low on the left side and high on the right side, for example, a second search signal Vramp2 shown in FIG. 5. The first search signal Vramp1 and the second search signal Vramp2 are related such that their search levels, or the slope waveform levels here, are inverted.

In the present embodiment, the first search signal Vramp1 is fed into the search signal input part 432 as the search signal Vramp when the mode signal fed to the input part 440 is one of the first mode signal MOD1 (the single-ended rolling shutter mode), the third mode signal MOD3 (the differential rolling shutter mode) and the fourth mode signal MOD 4 (the differential global shutter mode). In the present embodiment, on the other hand, the second search signal Vramp2 is fed into the search signal input part 432 as the search signal Vramp when the mode signal fed to the input part 440 is the second mode signal MOD2 (the single-ended global shutter mode).

The search signal input part 432 shown in FIG. 5 includes a fourth sampling capacitor (input capacitor) Cs4. The fourth sampling capacitor Cs4 is connected between the input node ND431 and the feeding line of the search signal Vramp.

The second opamp 431 compares the input signal voltage Vcmp input into the first input terminal (−) thereof through the third sampling capacitor Cs3 against the referential potential Vref2 fed to the second input terminal (+) and switches the level of the comparison output signal cmpout from the L level to the H level, or from the H level to the L level if the input signal voltage Vcmp crosses the referential potential Vref2. The time duration until the crossing is measured by a counter, which is not shown, so that the AD conversion is performed. As described above, the second opamp 431 serves as a comparator.

The third sampling capacitor (input capacitor) Cs3 is connected between the input node ND431 and the first input terminal (−) of the second opamp 431.

The sample holding switch part SW431 is connected at a terminal a thereof to the output node ND421 of the amplifying part 420 and at a terminal b thereof to the input node ND431. The sample holding switch part SW431 remains in the conduction state (ON state) between the terminals a and b when the control signal SH is at the H level and remains in the non-conduction state (OFF state) between the terminals a and b when the control signal SH is at the L level, for example. When the sample holding switch part SW431 remains in the conduction state, the AD converting part 430 allows the amplified output ampout from the amplifying part 420 to be input into the input node ND431.

The autozero switch part SW432 is connected at a terminal a thereof to the first input terminal (−) of the second opamp 431 and at a terminal b thereof to the output node ND432 (the output terminal of the second opamp 431), for example. The autozero switch part SW432 remains in the conduction state (ON state) between the terminals a and b when the control signal AZ2 is at the H level and remains in the non-conduction state (OFF state) between the terminals a and b when the control signal AZ2 is at the L level. The second opamp 431 is reset when the autozero switch part SW432 is in the conduction state.

In the column reading circuit 40 having the above-described configuration, when the single-ended first pixel signal pixout1 (VSL1) corresponding to the first mode signal MOD1 is input into the first sampling capacitor Cs1 of the amplifying part 420, the first feedback capacitor Cf1 of the amplifying part 420 is connected to the output node ND421 (the output terminal of the first opamp 421) by the first switch part SW421 and the second input terminal (+) of the first opamp 421 is connected to the referential potential Vref. In this case, the first search signal Vramp1 having a negative slope waveform is fed to the AD converting part 430 through the search signal input part 432.

Furthermore, in the column reading circuit 40, when the single-ended second pixel signal pixout2 (VSL2) corresponding to the second mode signal MOD2 is input into the first sampling capacitor Cs1 of the amplifying part 420, the first feedback capacitor Cf1 of the amplifying part 420 is connected to the offset potential VOS or the output node ND421 (the output terminal of the first opamp 421) by the first switch part SW421 and the second input terminal (+) of the first opamp 421 is connected to the referential potential Vref. In this case, the second search signal Vramp2 having a positive slope waveform, which can be obtained by inverting the level of the first search signal Vramp1, is fed to the AD converting part 430 through the search signal input part 432.

Furthermore, in the column reading circuit 40, when the differential first pixel signals pixout1d1 (VSL1 D1), pixout1d2 (VSL1D2) corresponding to the third mode signal MOD3 are input into the first sampling capacitor Cs1 and the second sampling capacitor Cs2 of the amplifying part 420, the first feedback capacitor Cf1 of the amplifying part 420 is connected to the output node ND421 (the output terminal of the first opamp 421) by the first switch part SW421. In this case, the first search signal Vramp1 having a negative slope waveform is fed to the AD converting part 430 through the search signal input part 432.

Furthermore, in the column reading circuit 40, when the differential second pixel signals pixout2d1 (VSL2D1), pixout2d2 (VSL2D2) corresponding to the fourth mode signal MOD4 are input into the first sampling capacitor Cs1 and the second sampling capacitor Cs2 of the amplifying part 420, the first feedback capacitor Cf1 of the amplifying part 420 is connected to the output node ND421 (the output terminal of the first opamp 421) by the first switch part SW421. In this case, the first search signal Vramp1 having a negative slope waveform is fed to the AD converting part 430 through the search signal input part 432.

As described above, the column reading circuit 40 of the present first embodiment is configured to be capable of processing the pixel signals corresponding to the first mode signal MOD1, the second mode signal MOD2, the third mode signal MOD3 and the fourth mode signal MOD4. Note that, in the present first embodiment, the pixel part 20 is configured to generate pixel signals corresponding to the first mode signal MOD1 and the second mode signal MOD2. Accordingly, the column reading circuit 40 of the first embodiment is expected to process the single-ended first pixel signal pixout1 (VSL1) obtained in the rolling shutter mode corresponding to the first mode signal MOD1 and the single-ended second pixel signal pixout2 (VSL2) obtained in the global shutter mode corresponding to the second mode signal MOD2.

The horizontal scanning circuit 50 scans the signals processed in the plurality of column signal processing circuits, for example, ADCs of the column reading circuit 40, transfers the signals in a horizontal direction, and outputs the signals to a signal processing circuit (not shown).

The timing control circuit 60 generates timing signals required for the signal processing in the pixel part 20, the vertical scanning circuit 30, the column reading circuit 40, the horizontal scanning circuit 50, and the like.

In the first embodiment, in the rolling shutter mode or first operation, the reading part 70 activates the first pixel array 230 and the second pixel arrays 250-1, 250-2 to sequentially access the pixels and reads the single-ended first pixel signals pixout1 in a row-by-row manner.

In the first embodiment, in the global shutter mode or second operation, the reading part 70 activates the first pixel array 230 and the retaining part array 240 with the selection transistors SEL1-Tr, SEL2-Tr being in the non-selected state (the signal SEL being at the low level) in the photoelectric conversion reading parts 221 of the first pixel array 230 and the second pixel arrays 250-1, 250-2, to read out the single-ended second pixel signals pixout2.

(The Stacked Structure of the Solid-State Imaging Device 10)

The following describes the stacked structure of the solid-state imaging device 10 relating to the first embodiment.

Figure 6:
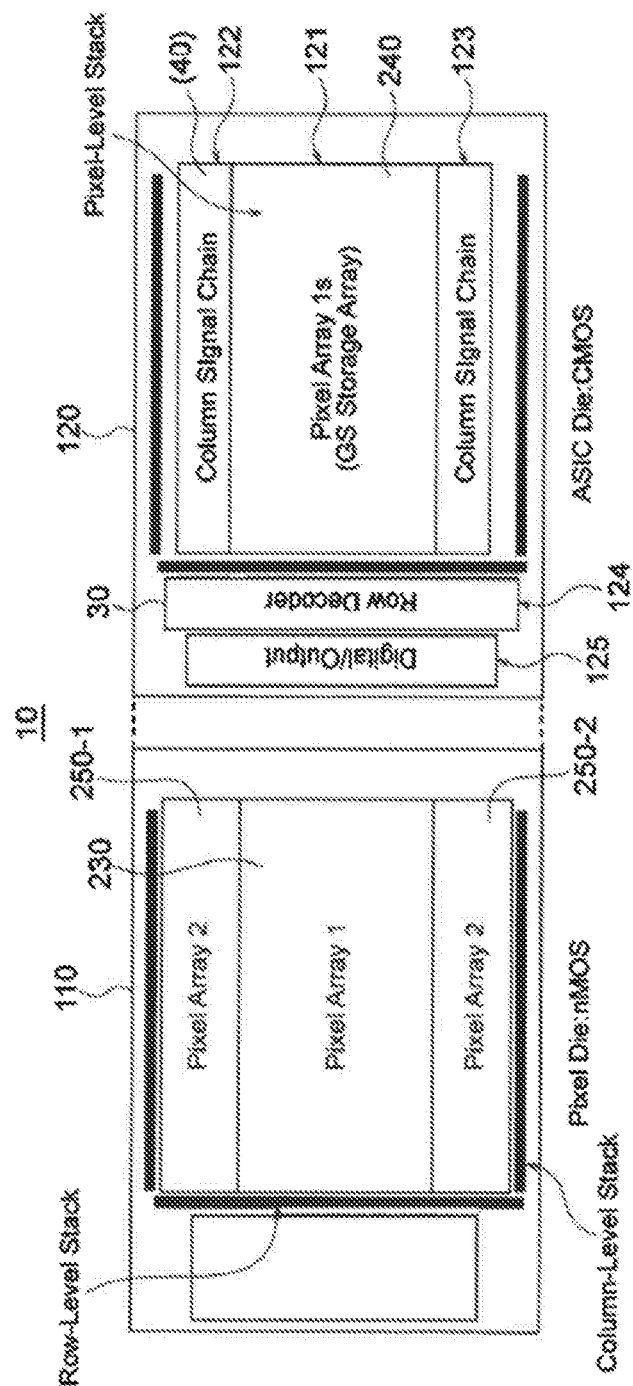
FIG. 6 is used to illustrate a stacked structure of the solid-state imaging device relating to the first embodiment of the present invention.

FIG. 6 is used to illustrate the stacked structure of the solid-state imaging device 10 relating to the first embodiment.

The solid-state imaging device 10 relating to the first embodiment has a stacked structure of a first substrate (an upper substrate) 110 and a second substrate (a lower substrate) 120. The solid-state imaging device 10 is formed as an imaging device having a stacked structure that is obtained, for example, by bonding wafers together and subjecting the bonded wafers to dicing. In the present example, the first substrate 110 is stacked on the second substrate 120.

In the first substrate 110, the first pixel array 230 is formed and centered around the central portion of the first substrate 110. In the first pixel array 230, the photoelectric conversion reading parts 211 of the first pixels 21 of the pixel part 20 are arranged. On both (upper and lower) sides of the first pixel array 230 in the extending direction of the first vertical signal lines LSGN11, the second pixel arrays 250-1, 250-2 are formed. Furthermore, in the first substrate 110, the first vertical signal lines LSGN11 are formed.

As described above, in the first embodiment, the photoelectric conversion reading parts 211 of the first pixels 21 and the photoelectric conversion reading parts 221 of the second pixels 22 are arranged in a matrix pattern in the first substrate 110.

In the second substrate 120, the retaining part array 240 (region 121) is formed and centered around the central portion of the second substrate 120, and the second vertical signal lines LSGN12 are also formed. In the retaining part array 240, the signal retaining parts 212 of the first pixels 21, which are connected to the output nodes ND21 of the photoelectric conversion reading parts 211 of the first pixel array 230, are arranged in a matrix pattern. Around the retaining part array 240, or on the upper and lower sides in the example shown in FIG. 6, regions 122, 123 are formed for the column reading circuit 40. The column reading circuit 40 may be configured such that it can be arranged in one of the regions on the upper and lower sides of the region 121 for the retaining part array 240. On the lateral side of the retaining part array 240, a region 124 for the vertical scanning circuit 30 and a region 125 for the digital and output systems are formed. In the second substrate 120, the vertical scanning circuit 30, the horizontal scanning circuit 50 and the timing control circuit 60 may be also formed.

In the above-described stacked structure, the output nodes ND21 of the photoelectric conversion reading parts 211 of the first pixel array 230 in the first substrate 110 are electrically connected to the input nodes ND22 of the signal retaining parts 212 of the first pixels 21 in the second substrate 120 through vias (die-to-die vias), microbumps, or the like as shown in FIG. 2, for example. Additionally, the first vertical signal lines LSGN11 in the first substrate 110 are electrically connected to the input part of the column reading circuit 40 in the second substrate 120 through vias (die-to-die vias), microbumps, or the like as shown in FIG. 2, for example.

(Reading Operation of the Solid-State Imaging Device 10)

The above describes the characteristic configurations and functions of the parts of the solid-state imaging device 10. The following now describes in detail how the solid-state imaging device 10 relating to the first embodiment reads the single-ended first pixel signals in the rolling shutter mode and the single-ended second pixel signals in the global shutter mode.

(Reading Operation in the Rolling Shutter Mode)

Figure 7:
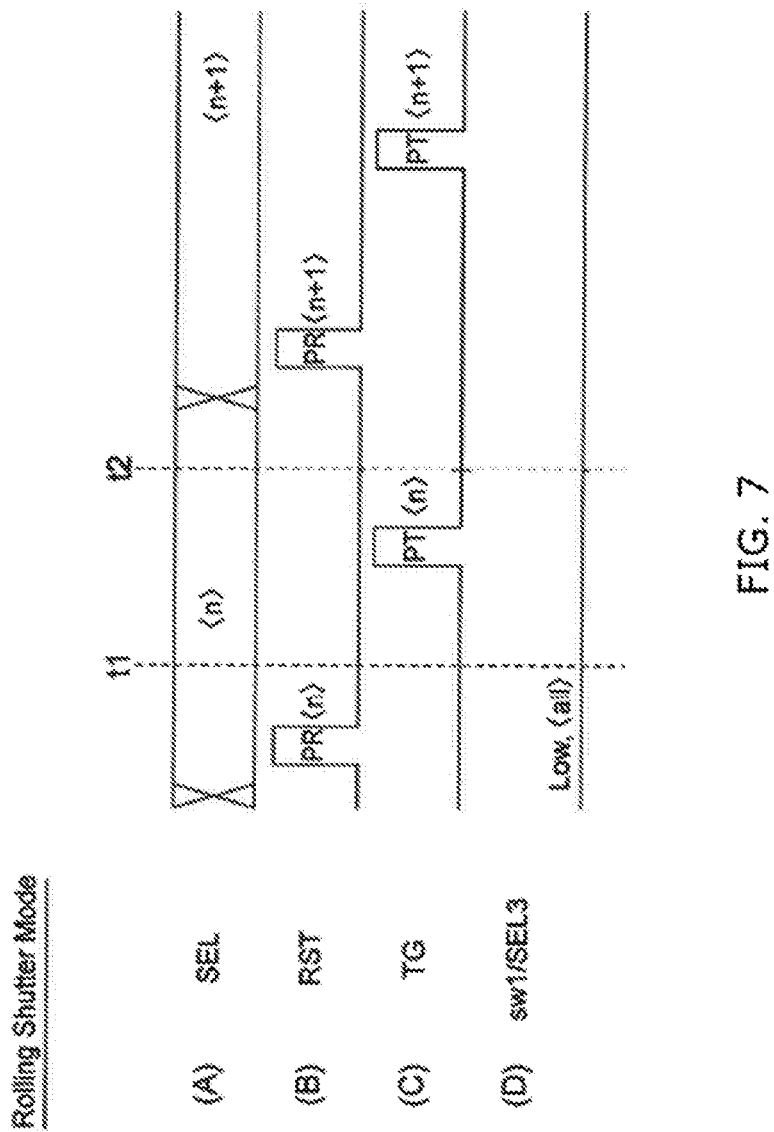
FIG. 7 is a timing chart including parts (A) to (D) to illustrate a reading operation performed mainly by the pixel part of the solid-state imaging device relating to the first embodiment of the present invention in a rolling shutter mode.
Figure 8:
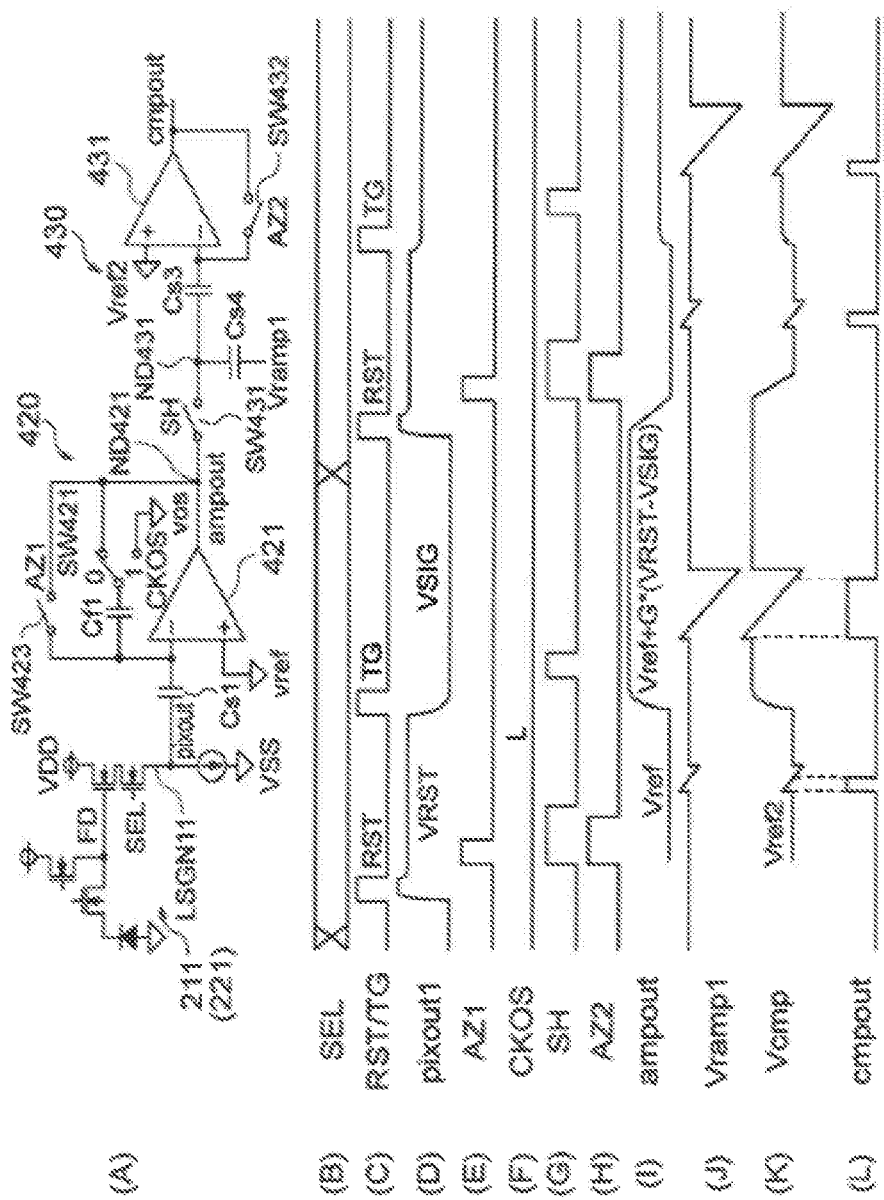
FIG. 8 is a timing chart including parts (A) to (L) to illustrate a reading operation performed mainly by the column reading circuit of the solid-state imaging device relating to the first embodiment of the present invention in the rolling shutter mode.

The following describes the reading operation in the rolling shutter mode. FIG. 7 is a timing chart including parts (A) to (D) to illustrate the reading operation performed mainly by the pixel part of the solid-state imaging device relating to the first embodiment of the present invention in the rolling shutter mode. FIG. 8 is a timing chart including parts (A) to (L) to illustrate the reading operation performed mainly by the column reading circuit of the solid-state imaging device relating to the first embodiment of the present invention in the rolling shutter mode.

In FIG. 7, the part (A) shows the control signal SEL for the selection transistor SEL1-Tr of the photoelectric conversion reading part 211 of the first pixel 21 and the selection transistor SEL2-Tr of the photoelectric conversion reading part 221 of the second pixel 22. In FIG. 7, the part (B) shows the control signal RST for the reset transistor RST1-Tr of the photoelectric conversion reading part 211 of the first pixel 21 and the reset transistor RST2-Tr of the photoelectric conversion reading part 221 of the second pixel 22. In FIG. 7, the part (C) shows the control signal TG for the transfer transistor TG1-Tr of the photoelectric conversion reading part 211 of the first pixel 21 and the transfer transistor TG2-Tr of the photoelectric conversion reading part 221 of the second pixel 22. In FIG. 7, the part (D) shows the control signal sw1 for the switch element SW21 of the signal retaining part 212 of the first pixel 21 and the control signal SEL3 for the selection transistor SEL3-Tr of the signal retaining part 212 of the first pixel 21.

In FIG. 8, the part (A) shows the equivalent circuit of the pixel and the column reading circuit, and the part (B) shows the control signal SEL for the selection transistor SEL1-Tr of the photoelectric conversion reading part 211 of the first pixel 21 and the selection transistor SEL2-Tr of the photoelectric conversion reading part 221 of the second pixel 22. In FIG. 8, the part (C) shows the control signal RST for the reset transistors RST1-Tr, RST2-Tr of the photoelectric conversion reading parts 211 and 221 of the first and second pixels 21 and 22, and the control signal TG for the transfer transistors TG1-Tr, TG2-Tr. In FIG. 8, the part (D) shows the single-ended first pixel signal pixout1 in the rolling shutter mode, the part (E) shows the control signal AZ1 for the autozero switch part SW423, the part (F) shows the control signal CKOS for the first switch part SW421, the part (G) shows the control signal SH for the sample holding switch part SW431, and the part (H) shows the control signal AZ2 for the autozero switch part SW432. In FIG. 8, the part (I) shows the output signal (amplified output) ampout from the first opamp 421, the part (J) shows the first search signal Vramp1, the part (K) shows the input signal (signal voltage) Vcmp for the second opamp 431, and the part (L) shows the output signal (comparison output) cmpout from the second opamp 431.

In the rolling shutter mode period, the control signal sw1 for the switch element SW21, which is designed to control the driving of all of the signal retaining parts 212 of the retaining part array 240, and the control signal SEL3 for controlling the selection transistor SEL3-Tr are set to the L level, so that the switch element SW21 and the selection transistor SEL3-Tr are controlled to remain in the non-conduction state. The constant current source Ibias3 is controlled to remain in the OFF state.

In other words, in the rolling shutter mode period, no access is made to any of the signal retaining parts 212 in the retaining part array 240 formed in the second substrate 120. In the rolling shutter mode period, sequential access is made to each row in the first pixel array 230 and the second pixel arrays 250-1, 250-2 formed in the first substrate 110.

In the rolling shutter mode period, as shown in the part (A) in FIG. 7, in order to select a given row in the first pixel array 230 or second pixel arrays 250-1, 250-2, the control signal SEL to control (drive) the photoelectric conversion reading parts 211 in the selected row of the first pixel array 230 or the photoelectric conversion reading parts 221 in the selected row of the second pixel arrays 250-1, 250-2 is set to the H level, so that the selection transistors SEL2-Tr (or SEL1-Tr) in the corresponding pixels are brought into the conduction state.

While the above selection is made, in a reset period PR, the reset transistors RST2-Tr (or RST1-Tr) remain selected and in the conduction state during a period of time in which the control line RST is at the H level, so that the floating diffusions FD are reset to the potential of the power supply line Vdd. After the reset period PR has elapsed (or after the reset transistors RST2-Tr or RST1-Tr are brought into the non-conduction state), a first reading period starts in which the pixel signals produced during the reset state are read out. The first reading period corresponds to the time duration that starts after the end of the reset period PR, includes the timing t1, and ends when the transfer period PT starts.

At the timing t1, the source follower transistors SF2-Tr (or SF1-Tr) in the selected row convert the charges in the floating diffusions FD22 (or FD21) into voltage signals representing the quantity of the charges, the voltage signals are immediately output to the first vertical signal line LSGN11 as the read-out reset signals VRST of a column output and fed to the column reading circuit 40.

At this point, the first reading period ends and the transfer period PT starts. In the transfer period PT, the transfer transistors TG2-Tr (or TG1-Tr) remain selected and in the conduction state during the period of time in which the control signal TG is at the high level (H), and the charges (electrons) obtained by the photoelectric conversion and stored in the photodiodes PD22 (or PD21) are transferred to the floating diffusions FD22 (or FD21). After the transfer period PT has elapsed (or after the transfer transistors TG2-Tr or TG1-Tr are brought into the non-conduction state), a second reading period starts, which includes a timing t2 at which the pixel signals corresponding to the charges obtained by the photoelectric conversion and stored in the photodiodes PD2 (or PD21) are read out.

At the timing t2 at which the second reading period starts, the source follower transistors SF2-Tr (or SF1-Tr) in the selected row convert the charges in the flowing diffusions FD22 (or FD21) into voltage signals corresponding to the quantity of the charges, which are immediately output to the first vertical signal line LSGN11 as the read-out luminance signals VSIG of the column output and fed to the column reading circuit 40.

Subsequently, the column reading circuit 40, which constitutes part of, for example, the reading part 70, amplifies and AD converts the read-out reset signal VRST and the read-out luminance signal VSIG of the first pixel signal pixout1, which are sequentially fed, and additionally calculates the difference between the signals {VRST−VSIG} and performs the CDS.

More specifically, in the rolling shutter mode period, the first mode signal MOD1 is fed to the input part 440 of the column reading circuit 40. In addition, in the rolling shutter mode period, the control signal CKOS at the L level is fed to the first switch part SW421 of the amplifying part 420 of the column reading circuit 40. In this way, the terminals a and b of the first switch part SW421 are connected, so that the first feedback capacitor Cf1 is connected between the first input terminal (−) of the first opamp 421 and the output node ND421. Additionally, in the rolling shutter mode period, the second switch part SW422 of the amplifying part 420 of the column reading circuit 40 remains in the conduction state, so that the second input terminal (+) of the first opamp 421 is connected to the referential potential Vref.

While these states are maintained, the first pixel signal is input into the input part 440, and the single-ended first pixel signal pixout1 obtained in the rolling shutter mode is fed from the first output terminal TO1 of the input part 440 to the first input terminal (−) of the first opamp 421, which is connected to the first sampling capacitor Cs1. To the first input terminal (−) of the first opamp 421, as shown in the part (D) of FIG. 8, the single-ended read-out reset signal VRST and read-out luminance signal VSIG, which are sequentially read out from the photoelectric conversion reading part 211 of the first pixel 21 and the photoelectric conversion reading part 221 of the second pixel 22, are sequentially fed.

Subsequently, during a predetermined period of time after the read-out reset signal VRST is input (during a predetermined period of time after the first reading period for reading the pixel signals produced during the reset state starts), as shown in the parts (E), (G) and (H) in FIG. 8, the control signals AZ1, SH and AZ2 are set to the H level. This brings the autozero switch part SW423 of the amplifying part 420 and the sample holding switch part SW431 and the autozero switch part SW432 of the AD converting part 430 into the conduction state. The lengths of the durations in which the control signals AZ1, SH and AZ2 remain at the H level decrease in the order of the control signals SH, AZ2 and AZ1. This resets the first opamp 421 of the amplifying part 420 and the second opamp 431 of the AD converting part 430. As a result, the output signal (amplified output) ampout of the first opamp 421 of the amplifying part 420 becomes equal in level to the referential potential Vref and is transferred to the AD converting part 430 through the sample holding switch part SW431 and retained in the third sampling capacitor Cs3 and the fourth sampling capacitor Cs4.

Following this, as shown in the part (J) in FIG. 8, the first search signal Vramp1 having a negative slope waveform is fed to the AD converting part 430 through the search signal input part 432. Then, as shown in the part (K) in FIG. 8, the signal voltage Vcmp, which is obtained by combining together the voltage retained in the fourth sampling capacitor Cs4 and the search signal Vramp1 provided by the search signal input part 432 is fed into the first input terminal (−) of the second opamp 431. In the second opamp 431, comparison is made between the input signal voltage Vcmp, which is input into the first input terminal (−) through the third sampling capacitor Cs3, and the referential potential Vref2, which is fed to the second input terminal (+), and the comparison output signal cmpout at the H level is output as shown in the part (L) in FIG. 8 until the input signal voltage Vcmp crosses the referential potential Vref2. The time duration in which the H level is kept is retained in a counter, which is not shown, so that AD conversion is performed.

When the first reading period ends, the read-out luminance signal VSIG, which has a lower potential than the read-out reset signal VRST, is fed to the amplifying part 420. The output signal ampout from the first opamp 421 is now the signal (Vref+G*(VRST−VSIG)) obtained by amplifying the referential potential Vref by the result of amplifying the difference between the read-out reset signal VRST and the read-out luminance signal VSIG having a lower potential by the capacitance ratio G. During a predetermined period of time after the transfer period ends, as shown in the part (G) in FIG. 8, the control signal SH remains at the H level, so that the sample holding switch part SW431 of the AD converting part 430 remains in the conduction state. As a result, the output signal (amplified output) ampout from the first opamp 421 of the amplifying part 420 becomes the signal (Vref+G*(VRST−VSIG)), is transferred to the AD converting part 430 through the sample holding switch part SW431 and is retained in the fourth sampling capacitor Cs4.

Following this, as shown in the part (J) in FIG. 8, the first search signal Vramp1 having a negative slope waveform is fed to the AD converting part 430 through the search signal input part 432. Then, as shown in the part (K) in FIG. 8, the signal voltage Vcmp, which is obtained by combining together the voltage retained in the fourth sampling capacitor Cs4 and the search signal Vramp1 provided by the search signal input part 432 is fed into the first input terminal (−) of the second opamp 431. In the second opamp 431, comparison is made between the input signal voltage Vcmp, which is input into the first input terminal (−) through the third sampling capacitor Cs3, and the referential potential Vref2, which is fed to the second input terminal (+), and the comparison output signal cmpout at the H level is output as shown in the part (L) in FIG. 8 until the input signal voltage Vcmp crosses the referential potential Vref2. The time duration in which the H level is kept is retained in a counter, which is not shown, so that AD conversion is performed.

Subsequently, the column reading circuit 40, which constitutes part of, for example, the reading part 70, calculates the difference {VRST−VSIG} between the read-out reset signal VRST and the read-out luminance signal VSIG and performs the CDS.

As described above, in the rolling shutter mode period, sequential access is made to each row in the first pixel array 230 and the second pixel arrays 250-1, 250-2 formed in the first substrate 110, and the above-described reading operation is sequentially performed.

(Reading Operation in the Global Shutter Mode)

Figure 9:
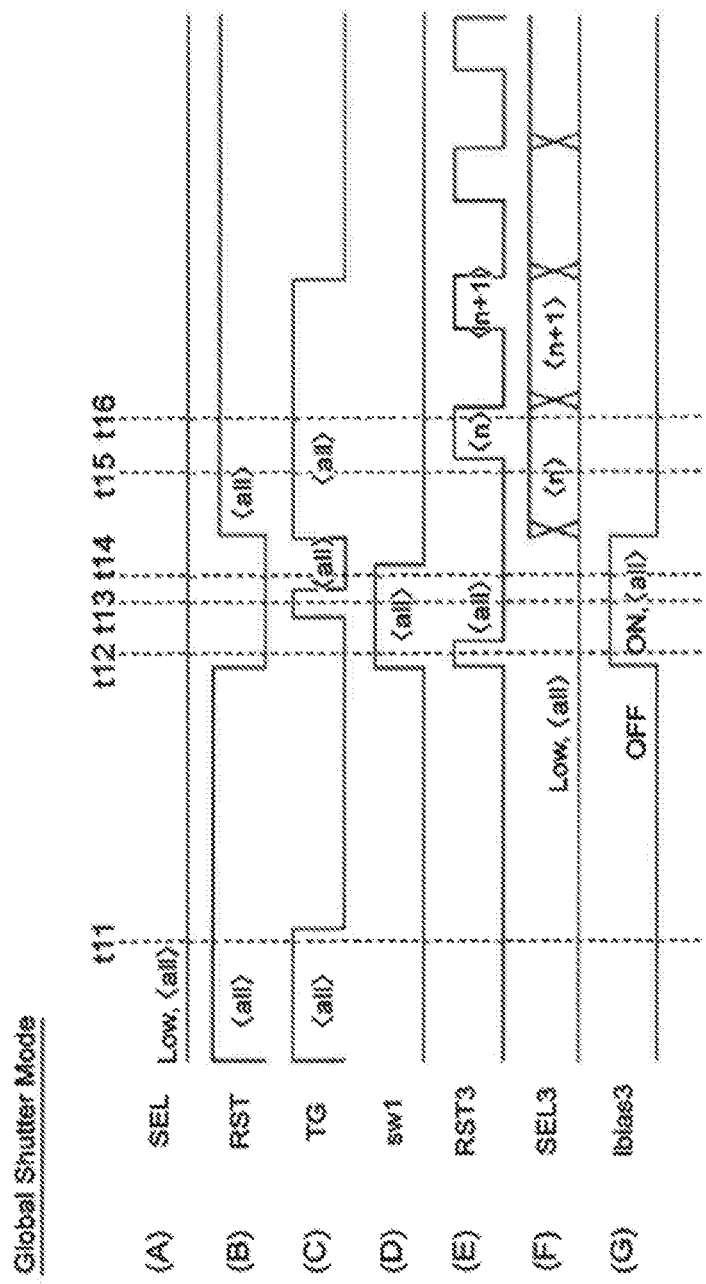
FIG. 9 is a timing chart including parts (A) to (G) to illustrate a reading operation performed mainly by the pixel part of the solid-state imaging device relating to the first embodiment of the present invention in a global shutter mode.
Figure 10:
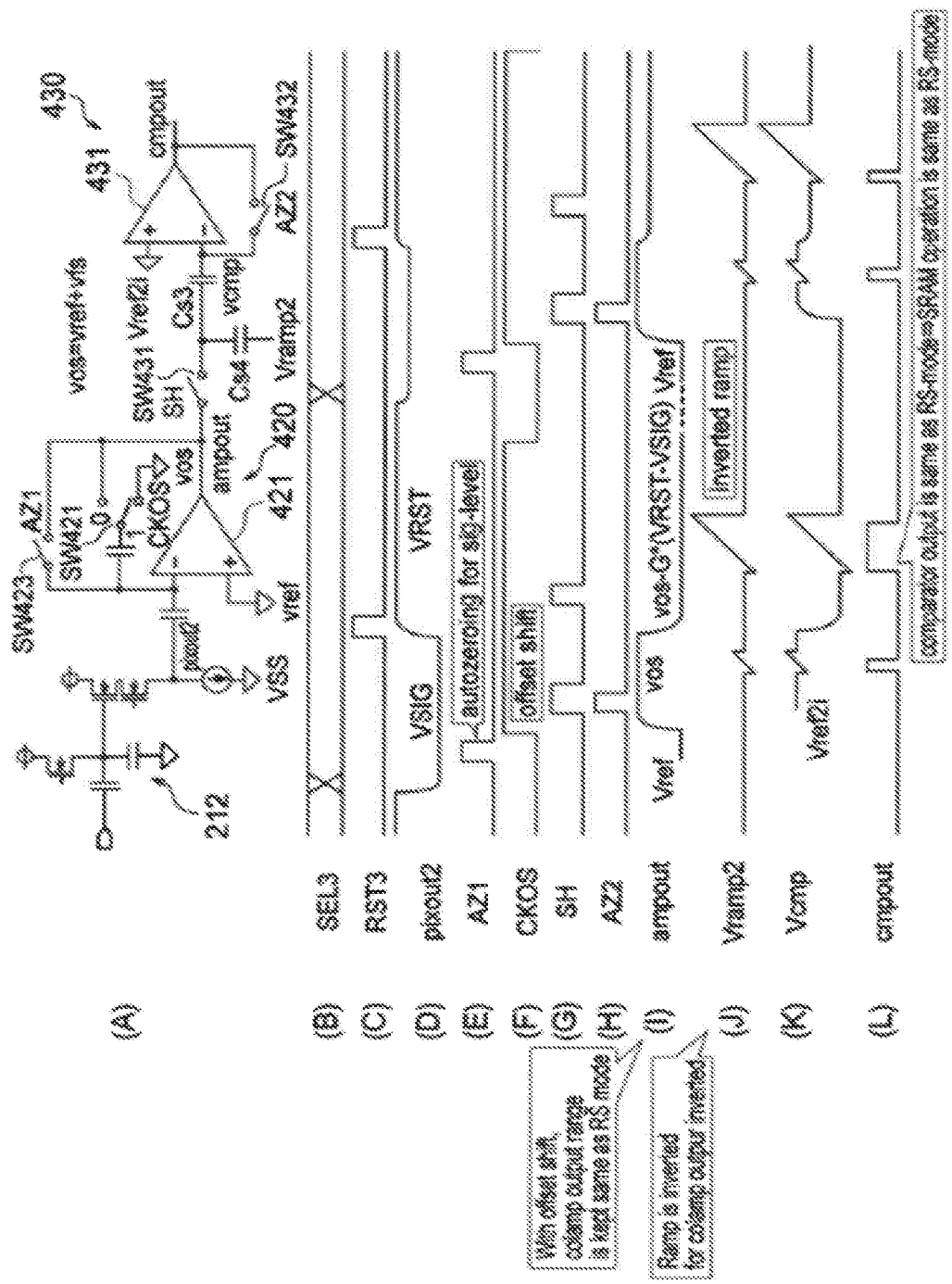
FIG. 10 is a timing chart including parts (A) to (L) to illustrate a reading operation performed mainly by the column reading circuit of the solid-state imaging device relating to the first embodiment of the present invention in the global shutter mode.

The following describes the reading operation in the global shutter mode. FIG. 9 is a timing chart including parts (A) to (G) to illustrate the reading operation performed mainly by the pixel part of the solid-state imaging device relating to the first embodiment of the present invention in the global shutter mode. FIG. 10 is a timing chart including parts (A) to (L) to illustrate the reading operation performed mainly by the column reading circuit of the solid-state imaging device relating to the first embodiment of the present invention in the global shutter mode.

In FIG. 9, the part (A) shows the control signal SEL for the selection transistor SEL1-Tr of the photoelectric conversion reading part 211 of the first pixel 21 and the selection transistor SEL2-Tr of the photoelectric conversion reading part 221 of the second pixel 22. In FIG. 9, the part (B) shows the control signal RST for the reset transistor RST1-Tr of the photoelectric conversion reading part 211 of the first pixel 21 and the reset transistor RST2-Tr of the photoelectric conversion reading part 221 of the second pixel 22. In FIG. 9, the part (C) shows the control signal TG for the transfer transistor TG1-Tr of the photoelectric conversion reading part 211 of the first pixel 21 and the transfer transistor TG2-Tr of the photoelectric conversion reading part 221 of the second pixel 22. In FIG. 9, the part (D) shows the control signal sw1 for the switch element SW21 of the signal retaining part 212 of the first pixel 21. In FIG. 9, the part (E) shows the control signal RST3 for the reset transistor RST3-Tr of the signal retaining part 212 of the first pixel 21. In FIG. 9, the part (F) shows the control signal SEL3 for the selection transistor SEL3-Tr of the signal retaining part 212 of the first pixel 21. In FIG. 9, the part (G) shows the state of the constant current source Ibias3 (ON or OFF) arranged in the signal retaining part 212 of the first pixel 21.

In FIG. 10, the part (A) shows the equivalent circuit of the pixel and the column reading circuit, and the part (B) shows the control signal SEL3 for the selection transistor SEL3-Tr of the signal retaining part 212 of the first pixel 21. In FIG. 10, the part (C) shows the control signal RST3 for the reset transistor RST3-Tr of the signal retaining part 212 of the first pixel 21. In FIG. 10, the part (D) shows the single-ended second pixel signal pixout2 in the global shutter mode, the part (E) shows the control signal AZ1 for the autozero switch part SW423, the part (F) shows the control signal CKOS for the first switch part SW421, the part (G) shows the control signal SH for the sample holding switch part SW431, and the part (H) shows the control signal AZ2 for the autozero switch part SW432. In FIG. 10, the part (I) shows the output signal (amplified output) ampout from the first opamp 421, the part (J) shows the second search signal Vramp2, the part (K) shows the input signal voltage Vcmp for the second opamp 421, and the part (L) shows the output signal (comparison output) cmpout from the second opamp 431.

In the global shutter mode, as shown in the part (A) of FIG. 9, the control signal SEL for the selection transistor SEL1-Tr of the photoelectric conversion reading part 211 of the first pixel 21 and the selection transistor SEL2-Tr of the photoelectric conversion reading part 221 of the second pixel 22 remains at the low level (L) during the entire duration of the global shutter mode period. This suspends (stops) the voltage signals from being output from the first pixel array 230 and the second pixel arrays 250-1, 250-2 to the first vertical signal line LSGN11 during the entire global shutter period. Accordingly, the second pixel arrays 250-1, 250-2 are controlled to remain in the non-activated state. On the other hand, the first pixel array 230 is in the activated state, so that the voltage signal can be output from the output node ND21 to the signal retaining part 212.

Referring to the parts (A) to (G) in FIG. 9, in the period of time starting at t11 and ending at t12, the photodiodes PD21 and the floating diffusions FD21 in all of the photoelectric conversion reading parts 211 in the first pixel array 230 are reset and charges are stored.

In this reset and charge storage period, as shown in the parts (D) to (G) in FIG. 9, the control signal sw1 for the switch element SW21, which is designed to control the driving of all of the signal retaining parts 212 of the retaining part array 240, the control signal RST3 for controlling the reset transistor RST3-Tr, and the control signal SEL3 for controlling the selection transistor SEL3-Tr remain at the L level, so that the switch element SW21, the reset transistor RST3-Tr and the selection transistor SEL3-Tr are controlled to remain in the non-conduction state and the constant current source Ibias3 is controlled to remain in the off state.

While these states are maintained, in the reset period, the reset transistor RST1-Tr remains selected and in the conduction state during a period in which the control signal RST is at the H level. While the control signal RST remains at the H level, the transfer transistor TG1-Tr remains selected and in the conduction state during the period in which the control signal TG is at the H level, so that the node at which the charges (electrons) obtained by the photoelectric conversion in the photodiode PD21 are stored is in the conduction state with the floating diffusion FD21. This resets the photodiode PD21 and the floating diffusion FD21 to the potential of the power supply line Vdd.

After the photodiode PD21 is reset, the control signal TG for the transfer transistor TG1-Tr is switched to the L level, so that the transfer transistor TG1-Tr is brought into the non-conduction state, and the charges obtained by the photoelectric conversion start to be stored in the photodiode PD21. At this point, the control signal RST for the reset transistor RST1-Tr is kept at the H level, and the floating diffusion FD21 is kept being reset to the potential of the power supply line Vdd. Subsequently, to end the reset period, before the timing t12, the control signal RST for the reset transistor RST1-Tr is switched to the L level, so that the reset transistor RST1-Tr is brought into the non-conduction state. After the reset period PR has elapsed (or after the reset transistor RST1-Tr is brought into the non-conduction state), a first reading period starts in which the pixel signals obtained during the reset state are read out. The first reading period includes the timing t12, and ends when the transfer period PT starts.

Likewise, in the signal retaining part 212, during a predetermined period of time including the timing t12, the control signal RST3 for controlling the reset transistor RST3-Tr is switched to and remains at the H level, the reset transistor RST3-Tr remains in the conduction state, and the node ND24 is reset to the potential of the power supply line Vdd of the power supply voltage VDD. During a predetermined period of time including the timings t12, t13 and t14, the control signal sw1 for the switch element SW21 is kept at the H level, so that the switch element SW21 remains in the on state (the conduction state). Likewise, during the predetermined period of time including the timings t12, t13 and t14, the constant current source Ibias3 is controlled to remain in the on state. The constant current source Ibias3 is turned off after the timing t14 is passed and the control signal sw1 for the switch element SW21 is switched to the L level so that the switch element SW21 is brought into the off state (the non-conduction state).

During a predetermined period of time including the timing t12, the source follower transistors SF1-Tr in all of the pixels convert the charges in the floating diffusions FD21 into voltage signals representing the quantity of the charges, and the voltage signals are transferred to the signal retaining parts 212 through the third signal line LSGN13 as the read-out reset signals VRST0 of the pixels and, through the switch elements SW21, retained in the sample-and-hold capacitors C21.

At this point, the first reading period ends, and a predetermined period of time including the timing t13 or a transfer period PT starts. During the transfer period PT, the transfer transistor TG1-Tr remains selected and in the conduction state in the period in which the control signal TG is at the high (H) level, so that the charges (electrons) produced by the photoelectric conversion and then stored in the photodiode PD21 are transferred to the floating diffusion FD21. After the transfer period PT has elapsed (or after the transfer transistor TG1-Tr is brought into the non-conduction state), a second reading period starts, which includes a timing t4 at which the pixel signals corresponding to the charges obtained by the photoelectric conversion and stored in the photodiodes PD2 are read out.

At the timing t14 at which the second reading period starts, the source follower transistors SF1-Tr in all of the pixels convert the charges in the floating diffusions FD21 into voltage signals representing the quantity of the charges, the voltage signals are transferred to the signal retaining parts 212 through the third signal line LSGN13 as the read-out luminance signals VSIG0 of the pixels, and the retaining signals VSIG (=VSIG0−VRST0) are retained in the sample-and-hold capacitors C21 and C22 through the switch elements SW21. This CDS operation can cancel the offset voltage of the source follower transistors SF1-Tr.

In order to read out the retaining signals VSIG that have been retained in the above manner, a given one of the rows in the retaining part array 240 is selected. To make such a selection, the control signal SEL3 for the selection transistors SEL3-Tr in the selected row is set to the H level, so that these selection transistors SEL3-Tr are in the conduction state. At the timing t15, the retaining signals VSIG (VSIG−VRST), which are retained in the sample-and-hold capacitors C21 and C22, are read out. To do so, in each signal retaining part 212, the source follower transistor SF3-Tr whose gate is connected to the node ND24 outputs, to the second vertical signal line LSGN12, the read-out luminance signal (VSIG−VRST) of a column out corresponding to the retained voltages in the sample-and-hold capacitors C21, C22 connected to the node ND24. The read-out luminance signal (VSIG−VRST) is fed to the column reading circuit 40.

Subsequently, during a predetermined period of time including a timing t16, the control signal RST3 is switched to the H level, the reset transistor RST3-Tr is brought into the conduction state, and the node ND24 is reset. In the predetermined period of time including the timing t16, the reset retaining signals (VRST), which are retained in the sample-and-hold capacitors C21 and C22 connected to the node ND24, are read out. To do so, in each signal retaining part 212, the source follower transistor SF3-Tr whose gate is connected to the node ND24 outputs, to the second vertical signal line LSGN12, the read-out reset signal (VRST) of a column out corresponding to the retained voltages in the sample-and-hold capacitors C21, C22 connected to the node ND24. The read-out reset signal (VRST) is fed to the column reading circuit 40.

Subsequently, in the column reading circuit 40, which constitutes part of, for example, the reading part 70, the read-out luminance signal (VSIG–VRST) read out in the predetermined period of time including the timing t15 and the read-out reset signal VRST read out in the predetermined period of time including the timing t16 are sequentially fed to the amplifying part 420 as the second pixel signal pixout2.

For example, the column reading circuit 40, which constitutes part of the reading part 70, amplifies and AD converts the read-out luminance signal VSIG (CMS) and the read-out reset signal VRST of the second pixel signal pixout2, which are sequentially fed through the input part 440. In addition, the column reading circuit 40 calculates the difference between the signals {VSIG–VRST} and performs the CDS to cancel the offset voltage of the source follower transistors SF3-Tr.

More specifically, in the single-ended global shutter mode period, the second mode signal MOD2 is fed to the input part 440 of the column reading circuit 40. Additionally, in the single-ended global shutter mode period, the second switch part SW422 of the amplifying part 420 of the column reading circuit 40 remains in the conduction state, so that the second input terminal (+) of the first opamp 421 is connected to the referential potential Vref.

While these states are maintained, the second pixel signal is input into the input part 440, and the single-ended second pixel signal pixout2 obtained in the global shutter mode is fed from the first output terminal TO1 of the input part 440 to the first input terminal (−) of the first opamp 421, which is connected to the first sampling capacitor Cs1. To the first input terminal (−) of the first opamp 421, as shown in the part (D) of FIG. 10, the single-ended read-out luminance signal VSIG and read-out reset signal VRST, which are read out from the photoelectric conversion reading part 211 of the first pixel 21 and also from the signal retaining part 212 in the stated order, are fed in the stated order.

Subsequently, during a predetermined period of time after the read-out luminance signal VSIG is input, the control signal AZ1 remains at the H level, as shown in the part (E) in FIG. 10. This keeps the autozero switch parts SW423 of the amplifying part 420 in the conduction state. This resets the first opamp 421 of the amplifying part 420. As a result, the output signal (amplified output) ampout from the first opamp 421 of the amplifying part 420 becomes equal to the referential potential Vref.

After this, in the single-ended global shutter mode period, the control signal CKOS for the first switch part SW421 of the amplifying part 420 of the column reading circuit 40 transits from the L level to the H level. In this way, connection is made between the terminal a and the terminal c, in place of between the terminal a and the terminal b, in the first switch part SW421, and the first feedback capacitor Cf1 is connected to the output of the first opamp 421, in place of the offset potential VOS. As a result, the output signal (amplified output) ampout from the first opamp 421 of the amplifying part 420 is shifted by the offset vfs relative to the referential potential Vref, in other words, offset-shifted to the offset potential VOS. This offset-shifting can contribute to maintaining the output range of the first opamp 421 at the same level as in the above-described rolling shutter mode.

During a predetermined period of time after the control signal CKOS is switched to the H level, the control signals SH and AZ2 remain at the H level as shown in the parts (G) and (H) in FIG. 10. In this way, the sample holding switch part SW431 and the autozero switch part SW432 of the AD converting part 430 remain in the conduction state. The lengths of the durations in which the control signals SH and AZ2 remain at the H level decrease in the order of the control signals SH and AZ2. This resets the second opamp 431 of the AD converting part 430. As for the output signal (amplified output) ampout of the first opamp 421 of the amplifying part 420, the component corresponding to the read-out luminance signal VSIG becomes equal in level to the offset potential VOS, is transferred to the AD converting part 430 through the sample holding switch part SW431 and retained in the third sampling capacitor Cs3 and the fourth sampling capacitor Cs4.

Following this, as shown in the part (J) in FIG. 10, the second search signal Vramp2 having a positive slope waveform, which can be obtained by inverting the level of the first search signal Vramp1 having a negative slope waveform, is fed to the AD converting part 430 through the search signal input part 432. Then, as shown in the part (K) in FIG. 8, the signal voltage Vcmp, which is obtained by combining together the voltage retained in the fourth sampling capacitor Cs4 and the search signal Vramp2 provided by the search signal input part 432, is fed into the first input terminal (−) of the second opamp 431. In the second opamp 431, comparison is made between the input signal voltage Vcmp, which is input into the first input terminal (−) through the third sampling capacitor Cs3, and the referential potential Vref2i, which is fed to the second input terminal (+), and the comparison output signal cmpout at the H level is output as shown in the part (L) in FIG. 10 until the input signal voltage Vcmp crosses the referential potential Vref2i. The time duration until the crossing is measured by a counter, which is not shown, so that AD conversion is performed.

The amplifying part 420 receives the read-out reset signal VRST, which has a higher potential than the read-out luminance signal VSIG. The component corresponding to the read-out reset signal VRST has a lower potential (VOS−G*(VRST−VSIG)) than the offset potential VOS by G*(VRST−VSIG) due to the offset-shifting. During a predetermined period of time after the transfer period ends, as shown in the part (G) in FIG. 10, the control signal SH remains at the H level, so that the sample holding switch part SW431 of the AD converting part 430 remains in the conduction state. As a result, the output signal (amplified output) ampout from the first opamp 421 of the amplifying part 420 becomes the signal (VOS−G*(VRST−VSIG)), is transferred to the AD converting part 430 through the sample holding switch part SW431 and is retained in the fourth sampling capacitor Cs4.

At this point, as shown in the part (J) in FIG. 10, the second search signal Vramp2 having a positive slope waveform is fed to the AD converting part 430 through the search signal input part 432. Then, as shown in the part (K) in FIG. 10, the signal voltage Vcmp, which is obtained by combining together the voltage retained in the fourth sampling capacitor Cs4 and the search signal Vramp2 provided by the search signal input part 432 is fed into the first input terminal (−) of the second opamp 431. In the second opamp 431, comparison is made between the input signal voltage Vcmp, which is input into the first input terminal (−) through the third sampling capacitor Cs3 and the referential potential Vref2i, which is fed to the second input terminal (+), and the comparison output signal cmpout at the H level is output as shown in the part (L) in FIG. 10 until the input signal voltage Vcmp crosses the referential potential Vref. The time duration until the crossing is measured by a counter, which is not shown, so that AD conversion is performed.

The comparison output signal cmpout exhibits the same result as in the above-described rolling shutter mode.

Additionally, the column reading circuit 40, which constitutes part of, for example, the reading part 70, calculates the difference {VSIG−VRST} between the read-out reset signal VRST and the read-out luminance signal VSIG and performs the CDS.

As described above, in the first embodiment, the solid-state imaging device 10 includes the pixel part 20 having pixels for performing photoelectric conversion arranged therein and the column reading circuit 40 having AD (analog-to-digital) conversion function for analog-to-digital converting the pixel signals read out from the pixels to the vertical signal lines. In the solid-state imaging device 10, the pixel signal read out from the pixel is at least either one of the first pixel signal pixout1 and the second pixel signal pixout2. The first pixel signal pixout1 includes the read-out reset signal VRST and the read-out luminance signal read out in the stated order from the pixels using a rolling shutter or first operation. The second pixel signal pixout2 includes the read-out luminance signal VSIG and the read-out reset signal VRST read out in the stated order from the pixel using a global shutter or second operation. The column reading circuit 40 includes the amplifying part 420 for amplifying the pixel signal and the AD converting part 430 for analog-to-digital converting the pixel signal amplified by the amplifying part 420, in connection with the search signal. The first search signal Vramp1 for the first pixel signal pixout1 and the second search signal Vramp2 for the second pixel signal pixout2 can be configured such that their search levels are inverted.

Accordingly, in the first embodiment, the column reading circuit 40 is capable of operating in different operational modes and processing read-out signals of different signal types using a single reading circuit which can eventually realize reduced circuit scale, less complicated control and lower power consumption. The first embodiment is particularly advantageous in that a reduced area can be achieved since it is not necessary to add a sample holding circuit to the pixels that are capable of producing pixel signals in both a low-noise rolling shutter mode, where the reset level is output first, and a global shutter mode, where no distortion is created due to a moving subject, and that the processing can be carried out at low voltage. To be specific, in the first opamp 421, which is a column amplifier, the first switch part SW421 and a bias signal line are added. The first switch part SW421 is capable of switching the connection target of the first feedback capacitor Cf1 between the output terminal of the first opamp 421 and the offset potential VOS, depending on whether the mode is the single-ended rolling shutter mode and the single-ended global shutter mode. The addition is the only change needed to be made in order to use the single reading circuit for different operational modes and read-out signals of different signal types.

Furthermore, in the solid-state imaging device 10 relating to the first embodiment, the pixel part 20 has pixels including a first pixel 21 that has a photoelectric conversion reading part and a signal retaining part and a second pixel 22 that has a photoelectric conversion reading part. With such configuration, the solid-state imaging device 10 is capable of operating both in a rolling shutter mode or a first operation and a global shutter more or a second operation. The solid-state imaging device 10 is configured, for example, as a stacked CMOS image sensor. In the solid-state imaging device 10 relating to the first embodiment, the pixel part 20 includes the first pixel array 230 in which the photoelectric conversion reading parts 211 of the plurality of first pixels 21 are arranged in a matrix pattern, the retaining part array 240 in which the signal retaining parts 212 of the plurality of first pixels 21 are arranged in a matrix pattern, and the second pixel arrays 250-1, 250-2 in which the photoelectric conversion reading parts of the plurality of second pixels are arranged in a matrix pattern. In the rolling shutter mode or first operation, the read-out signals from the photoelectric conversion reading parts 211, 221 of the first and second pixels 21 and 22 are directly output to the first vertical signal lines LSGN11 without traveling through the bypass paths. In the global shutter mode or second operation, the retaining signals of the signal retaining parts 212 of the first pixels 21 are output to the second vertical signal lines LSGN12.

Accordingly, the solid-state imaging device 10 relating to the first embodiment can prevent the increase in the configuration complexity and the reduction in area efficiency from the perspective of layout.

Furthermore, the solid-state imaging device 10 relating to the first embodiment can produce an image signal having a desired aspect ratio, which depends on the operational mode.

The solid-state imaging device 10 relating to the first embodiment has a stacked structure of the first substrate (an upper substrate) 110 and the second substrate (a lower substrate) 120. In the first substrate 110, the first pixel array 230 is formed and centered around the central portion of the first substrate 110. In the first pixel array 230, the photoelectric conversion reading parts 211 of the first pixels 21 of the pixel part 20 are arranged. On both (upper and lower) sides of the first pixel array 230 in the extending direction of the first vertical signal line LSGN11, the second pixel arrays 250-1, 250-2 are formed. In the first substrate 110, the first vertical signal line LSGN11 is also formed. In the second substrate 120, the retaining part array 240 (region 121) is formed and centered around the central portion of the second substrate 120, and the second vertical signal line LSGN12 is also formed. In the retaining part array 240, the signal retaining parts 212 of the first pixels 21, which are connected to the output nodes ND21 of the photoelectric conversion reading parts 211 of the first pixel array 230, are arranged in a matrix pattern. Around the retaining part array 240, regions 122, 123 are formed for the column reading circuit 40, for example.

Accordingly, the first embodiment can maximize the value per cost since the first substrate 110 is basically formed only with NMOS elements and the first pixel array and the second pixel arrays can increase the effective pixel region to the maximum.

Second Embodiment

Figure 11:
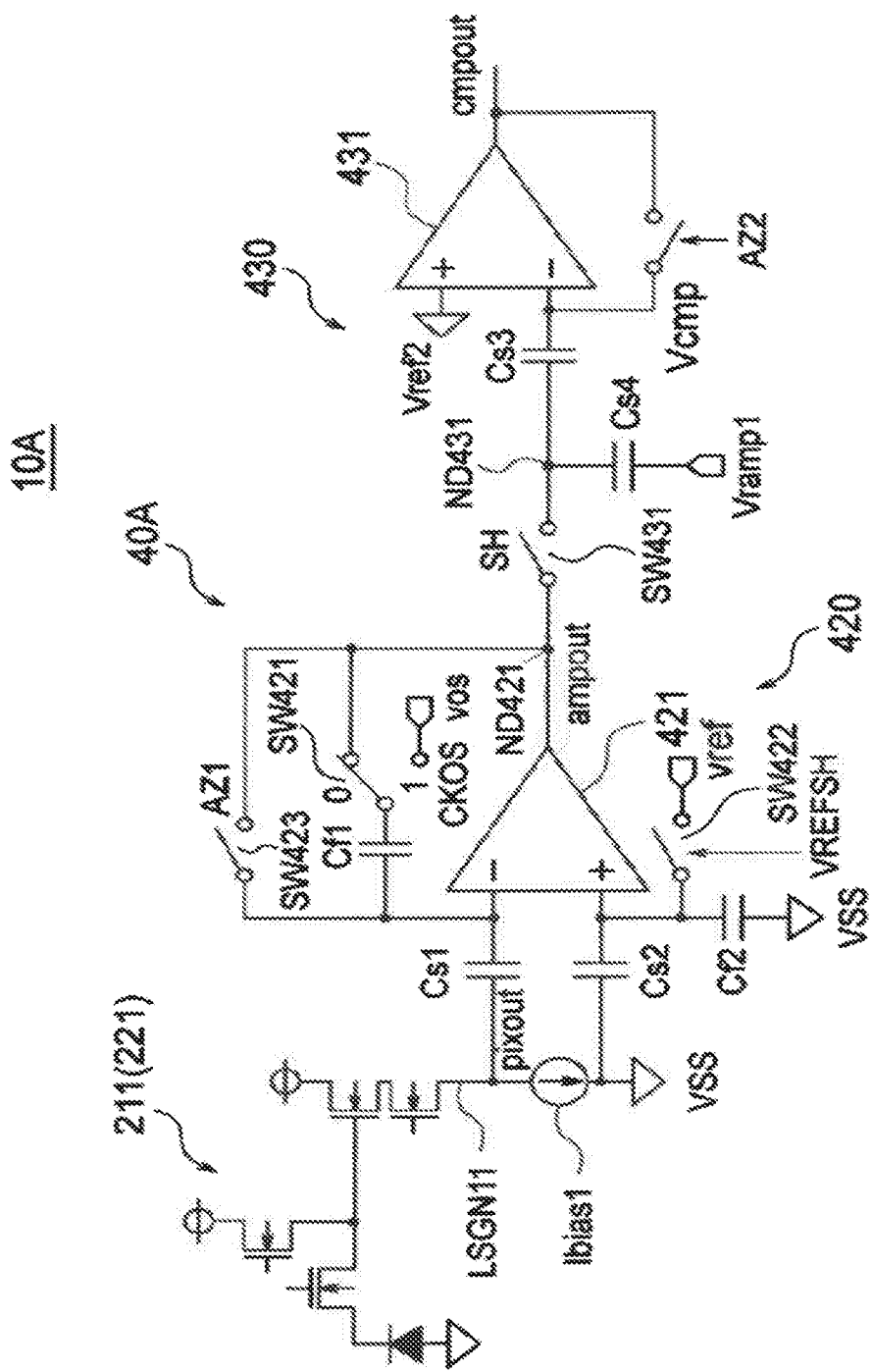
FIG. 11 shows an example configuration of a pixel and a column reading circuit of a solid-state imaging device relating to a second embodiment of the present invention.

FIG. 11 shows an example configuration of pixels and a column reading circuit of a solid-state imaging device relating to a second embodiment of the present invention.

The solid-state imaging device 10A relating to the second embodiment differs from the solid-state imaging device 10 relating to the above-described first embodiment in the following points. In the solid-state imaging device 10A relating to the second embodiment, the first pixel signal output to the column reading circuit 40A in the rolling shutter mode is provided as a differential pixel signal, in place of a single-ended pixel signal.

Specifically speaking, the first pixel signal pixout1 transferred through the first vertical signal line LSGN11 is fed, through the first sampling capacitor Cs1, to the first input terminal (−) of the first opamp 421 of the amplifying part 420 through the input part 440 of the column reading circuit 40A. The other signal traveling to the connection line between the current source Ibias1 and the reference potential VSS is fed, through the second sampling capacitor Cs2, to the second input terminal (+) of the first opamp 421 of the amplifying part 420 through the input part 440.

The remaining features of the solid-state imaging device 10A relating to the second embodiment are the same as the counterparts of the solid-state imaging device 10 relating to the first embodiment.

More specifically, in the differential rolling shutter mode period, the third mode signal MOD3 is fed to the input part 440 of the column reading circuit 40A. In addition, in the rolling shutter mode period, the control signal CKOS at the L level is fed to the first switch part SW421 of the amplifying part 420 of the column reading circuit 40A. In this way, the terminals a and b of the first switch part SW421 are connected, so that the first feedback capacitor Cf1 is connected between the first input terminal (−) of the first opamp 421 and the output node ND421. In addition, in the rolling shutter mode period, the control signal VREFSH is fed to the second switch part SW422 of the amplifying part 420 of the column reading circuit 40A as a clock.

Figure 12:
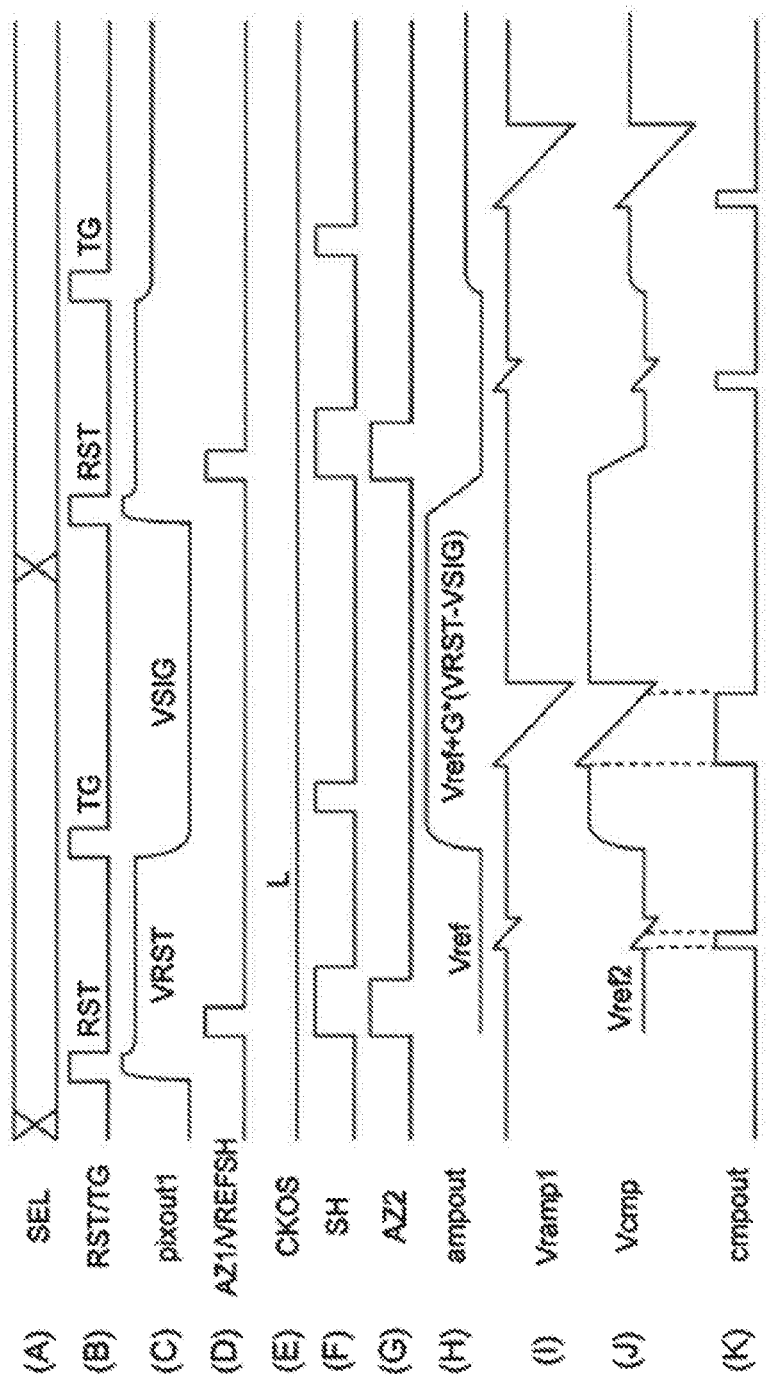
FIG. 12 is a timing chart including parts (A) to (K) to illustrate a reading operation performed mainly by a column reading circuit of the solid-state imaging device relating to the second embodiment of the present invention in a differential rolling shutter mode.

FIG. 12 is a timing chart including parts (A) to (K) to illustrate the reading operation performed mainly by the column reading circuit of the solid-state imaging device relating to the second embodiment of the present invention in the differential rolling shutter mode.

In FIG. 12, the part (A) shows the control signal SEL for the selection transistor SEL1-Tr of the photoelectric conversion reading part 211 of the first pixel 21 and the selection transistor SEL2-Tr of the photoelectric conversion reading part 221 of the second pixel 22. In FIG. 12, the part (B) shows the control signal RST for the reset transistor RST1-Tr of the photoelectric conversion reading part 211 of the first pixel 21 and the reset transistor RST2-Tr of the photoelectric conversion reading part 221 of the second pixel 22 and the control signal TG for the transfer transistors TG1-Tr, TG2-Tr. In FIG. 12, the part (C) shows the single-ended first pixel signal pixout1 produced in the global shutter mode, the part (D) shows the control signal AZ1 for the autozero switch part SW423 and the control signal VREFSH for the second switch part SW422, the part (E) shows the control signal CKOS for the first switch part SW421, the part (F) shows the control signal SH for the sample holding switch part SW431, and the part (G) shows the control signal AZ2 for the autozero switch part SW432. In FIG. 12, the part (H) shows the output signal (amplified output) ampout from the first opamp 421, the part (I) shows the first search signal Vramp1, the part (J) shows the input signal voltage Vcmp into the second opamp 431, and the part (K) shows the output signal (comparison output) cmpout from the second opamp 431.

The reading operation performed in the pixels and the column reading circuit 40A in the differential rolling shutter mode is the same as the reading operation performed in the pixels and the column reading circuit 40 in the single-ended rolling shutter mode, which has been described with reference to FIG. 8 including the parts (A) to (L), except for that the control signal VREFSH transits in a similar manner to the control signal AZ1. Therefore, the reading operation is not described in detail here.

The second embodiment can not only produce the same effects as the above-described first embodiment but also can cancel the column-wise ground (GND) floating in the rolling shutter pixels and eventually reduce noise such as shading, since one of the signals traveling to the connection line between the current source Ibias1 and the reference potential VSS is fed, through the second sampling capacitor Cs2, to the second input terminal (+) of the first opamp 421 of the amplifying part 420 through the input part 440. Alternatively, the pixels may operate in the global shutter mode. Specifically speaking, the second pixel signal pixout2 output from the second vertical signal line LSGN12 is fed, through the first sampling capacitor Cs1, to the first input terminal (−) of the first opamp 421 of the amplifying part 420 through the input part 440 of the column reading circuit 40A. The other signal traveling to the connection line between the current source Ibias1 and the reference potential VSS is fed, through the second sampling capacitor Cs2, to the second input terminal (+) of the first opamp 421 of the amplifying part 420 through the input part 440. In this case, noise such as shading can be also reduced in the global shutter pixels.

Third Embodiment

Figure 13:
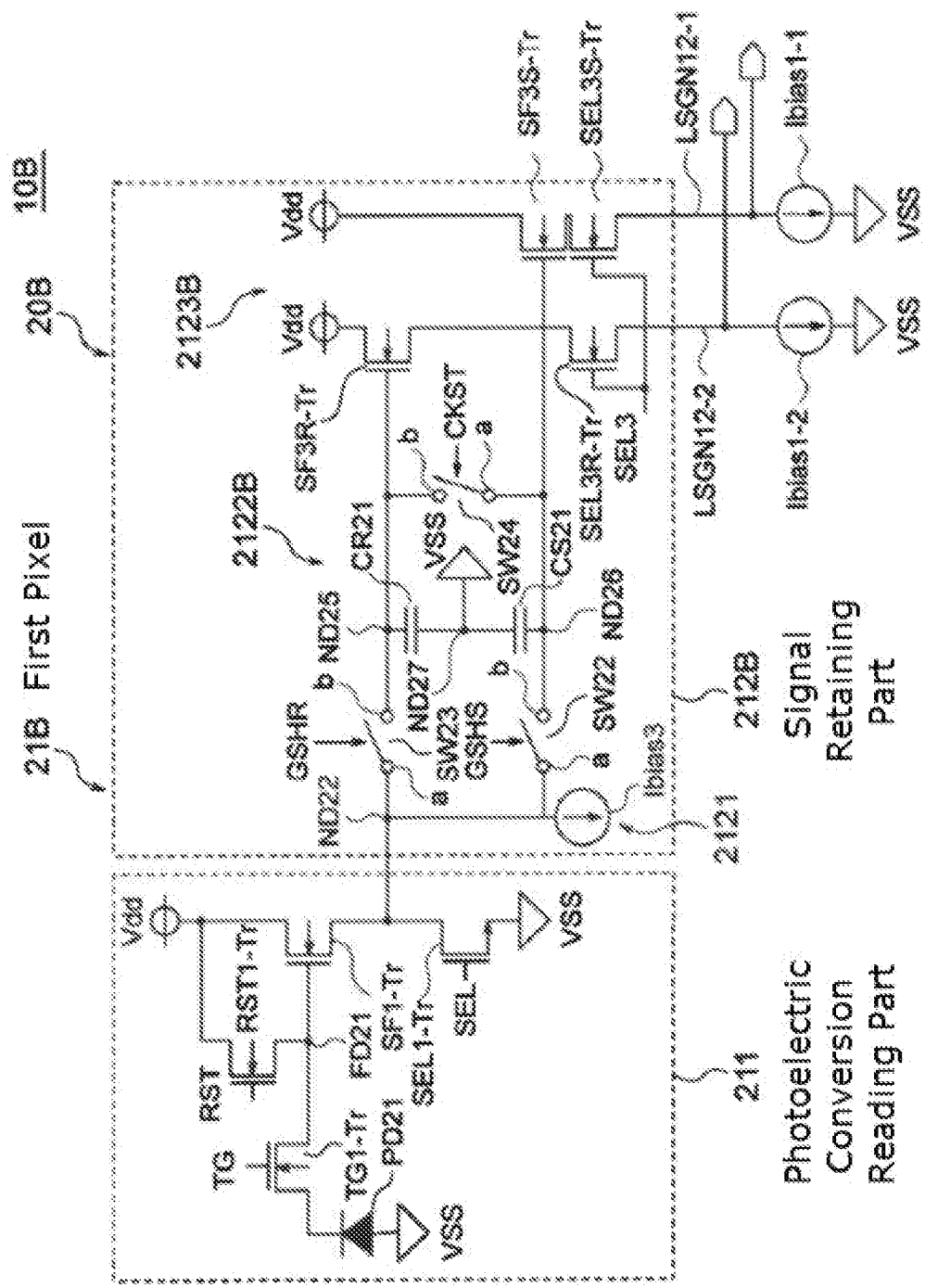
FIG. 13 shows an example configuration of a first pixel of a solid-state imaging device relating to a third embodiment of the present invention.

FIG. 13 shows an example configuration of a first pixel of a solid-state imaging device relating to a third embodiment of the present invention.

The solid-state imaging device 10B relating to the third embodiment differs from the solid-state imaging devices 10, 10A relating to the above-described first and second embodiments in terms of the configurations of the signal retaining part 212B in the first pixel 21B.

The signal retaining part 212B of the first pixel 21 basically includes an input part 2121 connected to a constant current source Ibias3, a sample holding part 2122B, an output part 2123B, and nodes ND22, ND25-ND27.

The constant current source Ibias3 is connected between the node ND22 and the reference potential VSS and controlled to remain on, for example, during a predetermined period of time within a global shutter period.

In place of the constant current source Ibias3, a switch element may be provided, which is connected between the node ND22 and the reference potential VSS and controlled to remain on, for example, during a predetermined period of time within a global shutter period.

The sample holding part 2122B includes switch elements SSW22 to SW24, a reset sample-and-hold capacitor CR21, a sample-and-hold capacitor CS21, and nodes ND25 to ND27.

The switch element SW22 selectively maintains the connection between the sample-and-hold capacitor CS21 of the sample holding part 2122B and the output node ND21 of the photoelectric conversion reading part 211 through the node ND26 during a global shutter period or second period. The terminal a of the switch element SW22 is connected to the input node ND22, which is connected to a third signal line LSGN13, and the terminal b of the switch element SW22 is connected to the node ND26. The terminals a and b of the switch element SW22 are kept connected and the switch element SW22 is in the conduction state during the period in which, for example, the control signal GSHS is at the high level. The sample-and-hold capacitor CS21 is connected between the node ND26 and the node ND27 connected to the reference potential VSS.

The switch element SW23 selectively maintains the connection between the reset sample-and-hold capacitor CR21 of the sample holding part 2122B and the output node ND21 of the photoelectric conversion reading part 211 through the node ND25 during a global shutter period or second period. The terminal a of the switch element SW23 is connected to the input node ND22, which is connected to the third signal line LSGN13, and the terminal b of the switch element SW23 is connected to the node ND25. The terminals a and b of the switch element SW23 are kept connected and the switch element SW22 is in the conduction state during the period in which, for example, the control signal GSHR is at the high level. The reset sample-and-hold capacitor CR21 is connected between the node ND25 and the node ND27 connected to the reference potential VSS.

The switch element SW24 maintains the connection between the node ND25 connected to the reset sample-and-hold capacitor CR21 and the node ND26 connected to the sample-and-hold capacitor CS21 during the global shutter period or second period. The terminal a of the switch element SW24 is connected to the node ND26, and the terminal b of the switch element SW24 is connected to the node ND25. The terminals a and b of the switch element SW24 are kept connected and the switch element SW24 is in the conduction state during the period in which, for example, the control signal CKST is at the high level. This can average the reset level and the signal level of the selected row.

The switch elements SW22 to SW24 are formed by MOS transistors, for example, n-channel MOS (NMOS) transistors.

The output part 2123B includes a source follower transistor SF3S-Tr for basically outputting the signal retained in the sample-and-hold capacitor CS21 at a level determined by the retained voltage in the global shutter period or second period, and outputs the retained signal selectively through the selection transistor SEL3S-Tr, to a second vertical signal line LSGN12-1, which is to be driven by a constant current source Ibias1-1.

The source follower transistor SF3S-Tr and the selection transistor SEL3S-Tr are connected in series between the power supply line Vdd and the second vertical signal line LSGN12-1, which is to be driven by the constant current source Ibias1-1.

The gate of the source follower transistor SF3S-Tr is connected to the node ND26, and the selection transistor SEL3S-Tr is controlled by a control signal SEL3 applied to the gate through a control line. The selection transistor SEL3S-Tr remains selected and in the conduction state during a selection period in which the control signal SEL3 is at the H level. This causes the source follower transistor SF3S-Tr to output, to the second vertical signal line LSGN12-1, the read-out voltage (VRST, VSIG) of a column output corresponding to the average voltage or the retained voltage in the sample-and-hold capacitor CS21.

Furthermore, the output part 2123B includes a source follower transistor SF3R-Tr for basically outputting the signal retained in the reset sample-and-hold capacitor CR21 at a level determined by the retained voltage in the global shutter period or second period, and outputs the retained signal selectively through the selection transistor SEL3R-Tr, to the second vertical signal line LSGN12-2, which is to be driven by a constant current source Ibias1-2.

The source follower transistor SF3R-Tr and the selection transistor SEL3R-Tr are connected in series between the power supply line Vdd and the second vertical signal line LSGN12-2, which is to be driven by the constant current source Ibias1-2.

The gate of the source follower transistor SF3R-Tr is connected to the node ND25, and the selection transistor SEL3R-Tr is controlled by a control signal SEL3 applied to the gate through a control line. The selection transistor SEL3R-Tr remains selected and in the conduction state during a selection period in which the control signal SEL3 is at the H level. This causes the source follower transistor SF3R-Tr to output, to the second vertical signal line LSGN12-2, the read-out voltage (VRST, VSIG) of a column output corresponding to the average voltage or the retained voltage in the reset sample-and-hold capacitor CR21.

(Reading Operation in the Differential Global Shutter Mode)

Figure 14:
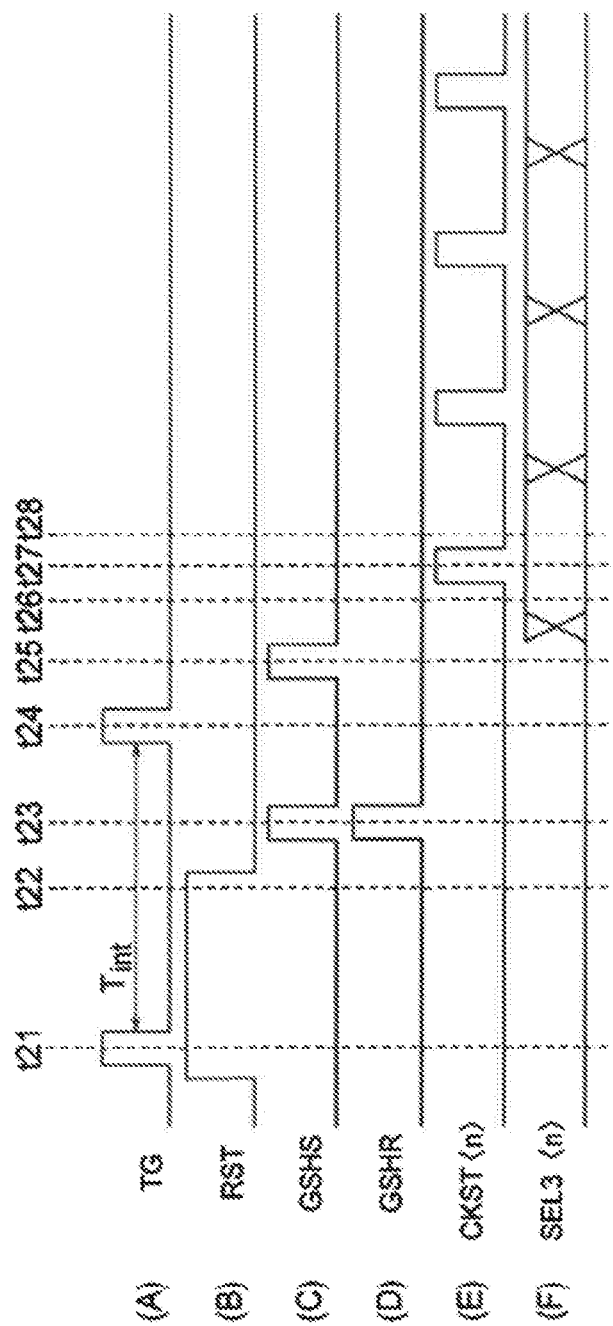
FIG. 14 is a timing chart including parts (A) to (F) to illustrate a reading operation performed mainly by a pixel part of the solid-state imaging device relating to the third embodiment of the present invention in a global shutter mode.
Figure 15:
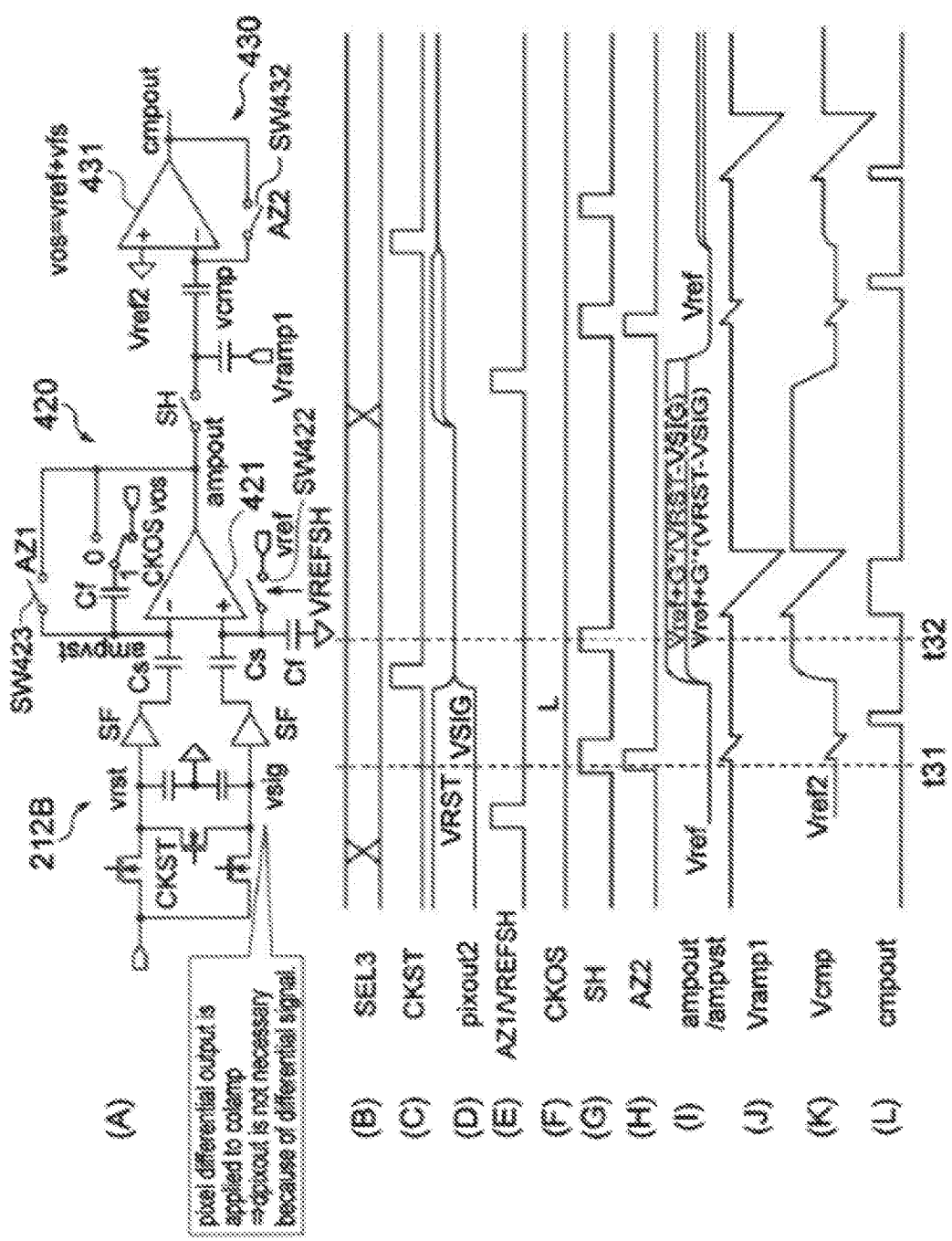
FIG. 15 is a timing chart including parts (A) to (L) to illustrate a reading operation performed mainly by a column reading circuit of the solid-state imaging device relating to the third embodiment of the present invention in the global shutter mode.

The following describes the reading operation in the differential global shutter mode. FIG. 14 is a timing chart including parts (A) to (F) to illustrate the reading operation performed mainly by the pixel part of the solid-state imaging device relating to the third embodiment of the present invention in the global shutter mode. FIG. 15 is a timing chart including parts (A) to (L) to illustrate the reading operation performed mainly by the column reading circuit of the solid-state imaging device relating to the third embodiment of the present invention in the global shutter mode.

In FIG. 14, the part (A) shows the control signal TG for the transfer transistor TG1-Tr of the photoelectric conversion reading part 211 of the first pixel 21. In FIG. 14, the part (B) shows the control signal RST for the reset transistor RST1-Tr of the photoelectric conversion reading part 211 of the first pixel 21. In FIG. 14, the part (C) shows the control signal GSHS for the switch element SW22 of the signal retaining part 212B of the first pixel 21. In FIG. 14, the part (D) shows the control signal GSHR for the switch element SW23 of the signal retaining part 212B of the first pixel 21. In FIG. 14, the part (E) shows the control signal CKST for the switch element SW24 of the signal retaining part 212B of the first pixel 21. In FIG. 14, the part (F) shows the control signal SEL3 for the selection transistor SEL3-Tr of the signal retaining part 212 of the first pixel 21.

In FIG. 15, the part (A) shows the equivalent circuit of the pixel and the column reading circuit, and the part (B) shows the control signal SEL3 for the selection transistors SEL3R-Tr, SEL3S-Tr of the signal retaining part 212B of the first pixel 21. In FIG. 15, the part (C) shows the control signal CKST for the switch element SW24 of the signal retaining part 212B of the first pixel 21. In FIG. 15, the part (D) shows the differential second pixel signal pixout2 produced in the global shutter mode, the part (E) shows the control signal AZ1 for the autozero switch part SW423 and the control signal VREFSH for the second switch part SW422, the part (F) shows the control signal CKOS for the first switch part SW421, the part (G) shows the control signal SH for the sample holding switch part SW431, and the part (H) shows the control signal AZ2 for the autozero switch part SW432. In FIG. 15, the part (I) shows the output signal (amplified output) ampout from the first opamp 421 and the feedback signal ampvst, the part (J) shows the first search signal Vramp1, the part (K) shows the input signal voltage Vcmp into the second opamp 431, and the part (L) shows the output signal (comparison output) cmpout from the second opamp 431.

In the global shutter mode, the control signal SEL for the selection transistor SEL1-Tr of the photoelectric conversion reading part 211 of the first pixel 21 and the selection transistor SEL2-Tr of the photoelectric conversion reading part 221 of the second pixel 22 remains at the low level (L) during the entire global shutter period. This suspends (stops) the voltage signals from being output from the first pixel array 230 and the second pixel arrays 250-1, 250-2 to the first vertical signal line LSGN11 during the entire global shutter period. Accordingly, the second pixel arrays 250-1, 250-2 are controlled to remain in the non-activated state. On the other hand, the first pixel array 230 is in the activated state, so that the voltage signal can be output from the output node ND21 to the signal retaining part 2128.

Referring to the parts (A) to (F) in FIG. 14, the period starting at the timing t21 and ending at the timing t24 denotes the period Tint of resetting the photodiodes PD21 and the floating diffusions FD21 in all of the photoelectric conversion reading parts 211 in the first pixel array 230 and storing the charges.

In this reset and charge storage period, the control signals GSHS, GSHR, CKST for the switch elements SW22 to SW24, which are designed to control the driving of all of the signal retaining parts 2128 of the retaining part array 240, and the control signal SEL3 for controlling the selection transistor SEL3-T remain at the L level, so that the switch elements SW22 to SW24, and the selection transistor SEL3-Tr remain in the non-conduction state and the constant current source Ibias3 is controlled to remain in the off state.

While these states are maintained, in the reset period, the reset transistor RST1-Tr remains selected and in the conduction state during the period in which the control signal RST is at the H level. While the control signal RST remains at the H level, the transfer transistor TG1-Tr remains selected and in the conduction state during the period in which the control signal TG is at the H level, so that the node at which the charges (electrons) obtained by the photoelectric conversion in the photodiode PD21 are stored is in the conduction state with the floating diffusion FD21. This resets the photodiode PD21 and the floating diffusion FD21 to the potential of the power supply line Vdd.

After the photodiode PD21 is reset, the control signal TG for the transfer transistor TG1-Tr is switched to the L level, so that the transfer transistor TG1-Tr is brought into the non-conduction state, and the charges obtained by the photoelectric conversion start to be stored in the photodiode PD21. To do so, the control signal RST for the reset transistor RST1-Tr is kept at the H level, so that the floating diffusion FD21 is kept being reset to the potential of the power supply line Vdd. While these states are maintained, at the timing t22, the source follower transistor SF1-Tr in each photoelectric conversion reading part 211 converts the charges in the floating diffusion FD21 into a voltage signal representing the quantity of the charges and outputs the voltage signal from the output node ND21 as the read-out reset signal VRST of a column output. Subsequently, to end the reset period, after the timing t22 is passed, the control signal RST for the reset transistor RST1-Tr is switched to the L level, so that the reset transistor RST1-Tr is brought into the non-conduction state. After this, during a predetermined period of time including the timing t23, the control signal GSHS for the switch element SW22 in the signal retaining part 212B of the first pixel 21 and the control signal GSHR for the switch element SW23 remain at the H level, so that the sample-and-hold capacitor CS21 and the reset sample-and-hold capacitor CR21 are initialized. Additionally, the constant current source Ibias3 is controlled to remain in the on state. During a predetermined period of time including the timing t23, the read-out reset signal VRST output from the output node ND21 of each photoelectric conversion reading part 211 is transferred to the corresponding signal retaining part 212B through the third signal line LSGN13 and retained in the reset sample-and-hold capacitor CR21 through the switch element SW23. After this, the control signal GSHS for the switch element SW22 in the signal retaining part 212B of the first pixel 21B and the control signal GSHR for the switch element SW23 are switched to the L level, so that the switch elements SW22 and SW23 are brought into the non-conduction state.

Here, a predetermined period of time including the timing t24 is referred to as the transfer period. In the transfer period, the transfer transistor TG1-Tr in each photoelectric conversion reading part 211 remains selected and in the conduction state during the period in which the control signal TG is at the H level, so that the charges (electrons) produced by the photoelectric conversion and then stored in the photodiode PD21 are transferred to the floating diffusion FD21. After the transfer period ends, the control signal TG for the transfer transistor TG1-Tr is switched to the L level, so that the transfer transistor TG1-Tr is brought into the non-conduction state.

Concurrently with the timing at which the control signal TG for the transfer transistor TG1-Tr is switched to the L level in the photoelectric conversion reading part 211 and the transfer period ends, the following control is performed in every signal retaining part 212B in the retaining part array 240. In the signal retaining part 212B, during a predetermined period of time including a timing t25, the control signal GSHS remains at the H level and the switch element SW22 remains in the conduction state, so that the constant current source Ibias3 is controlled to remain in the on state.

In this way, during the predetermined period of time including the timing t25, the read-out luminance signal VSIG output from the output node ND21 of each photoelectric conversion reading part 211 is transferred to the corresponding signal retaining part 212 through the third signal line LSGN13 and retained in the sample-and-hold capacitor CS21 through the switch element SW22.

After the read-out luminance signal VSIG is retained in the sample-and-hold capacitor CS21, the control signal GSHS is switched to the L level, so that the switch element SW22 is brought into the non-conduction state.

In order to read the signal that has been retained in the above-described manner, a given one of the rows in the retaining part array 240 is selected. To make such a selection, the control signal SEL3 for the selection transistors SEL3-Tr in the selected row is set to the H level, so that these selection transistors SEL3S-Tr and SEL3R-Tr are brought into the conduction state. At the timing t26, the read-out luminance signal VSIG retained in the sample-and-hold capacitor CS21 is read, and, at the same time, the read-out reset signal VRST retained in the reset sample-and-hold capacitor CR21 is read.

More specifically, in each signal retaining part 2128, the source follower transistor SF3S-Tr, whose gate is connected to the node ND26, outputs the read-out luminance signal VSIG of a column output to the second vertical signal line LSGN12-1 at a level corresponding to the retained voltage in the sample-and-hold capacitor CS21 connected to the node ND26. The read-out luminance signal VSIG is fed to the column reading circuit 40. Likewise, in each signal retaining part 2128, the source follower transistor SF3R-Tr, whose gate is connected to the node ND25, outputs the read-out reset signal VRST of a column output to the second vertical signal line LSGN12-2 at a level corresponding to the retained voltage in the reset sample-and-hold capacitor CR21 connected to the node ND25. The read-out reset signal VRST is fed to the column reading circuit 40.

After this, in the signal retaining part 212B, during a predetermined period of time including the timing t27, the control signal CKST remains at the H level, so that the switch element SW24 remains in the conduction state. This can average the reset level and the signal level for the selected row. At the timing t28, the read-out luminance signal VSIG retained in the sample-and-hold capacitor CS21 and the read-out reset signal VRST retained in the reset sample-and-hold capacitor CR21 are averaged and the signals are read out in parallel.

More specifically, in each signal retaining part 2128, the source follower transistor SF3S-Tr, whose gate is connected to the node ND26, outputs an averaged signal of a column output to the second vertical signal line LSGN12-1 at a level corresponding to the averaged voltage in the node ND26. The averaged signal is fed to the column reading circuit 40. Likewise, in each signal retaining part 2128, the source follower transistor SF3R-Tr, whose gate is connected to the node ND25, outputs an averaged signal AVSR of a column output to the second vertical signal line LSGN12-2 at a level corresponding to the averaged voltage in the node ND25. The averaged signal AVSR is fed to the column reading circuit 40.

Here, the following expressions can be obtained, where $V_{OS1}$, $V_{OS2}$ respectively denote the offsets of the source follower transistors SF3S-Tr, SF3R-Tr for outputting the signal level Vs and the reset level $V_R$ that are read out from the signal retaining part 2128.

[Mathematical Expression 1]

$$V_{OUTR}(t26) - V_{OUTS}(t26) =$$
$$V_R + V_{OS2} - (V_S + V_{OS1})$$
$$V_{OUTR}(t28) - V_{OUTS}(t28) = (V_R + V_S)/2 +$$
$$V_{OS2} - ((V_R + V_S)/2 + V_{OS1})$$
$$V_{OUTR}(t26) - V_{OUTS}(t26) -$$
$$\{V_{OUTR}(t28) - V_{OUTS}(t28)\} = V_R - V_S$$

Here, $V_{OUTR}(t26)$ denotes the reset signal voltage read out at the timing t26, $V_{OUTS}(t26)$ denotes the signal voltage read out at the timing t26, $V_{OUTR}(t28)$ denotes the reset signal voltage read out at the timing t28, and $V_{OUTS}(t28)$ denotes the signal voltage read out at the timing t28.

In the above-described manner, the offsets of the source follower transistors SF3S-Tr, SF3R-Tr can be canceled by the CDS processing performed on the differential signals in the circuit of the later stage.

In the column reading circuit 40, which constitutes part of, for example, the reading part 70, the read-out luminance signal VSIG and the read-out reset signal VRST that are read out concurrently in parallel at the timing t26 and the averaged signal AVSR that is read out at the timing t28 are in parallel fed to the amplifying part 420 as the second pixel signal pixout2.

In the column reading circuit 40, which constitutes part of, for example, the reading part 70, the read-out luminance signal VSIG and the read-out reset signal VRST and the averaged signal AVSR of the second pixel signal pixout2 that are fed concurrently in parallel through the input part 440 are subjected to amplification and AD conversion, and the difference between the signals {VRST-VSIG-AVSR)} is calculated so that the CDS is performed.

More specifically, in the differential global shutter mode period, the fourth mode signal MOD4 is fed to the input part 440 of the column reading circuit 40. In addition, in the differential global shutter mode period, the control signal CKOS at the L level is fed to the first switch part SW421 of the amplifying part 420 of the column reading circuit 40. In this way, the terminals a and b of the first switch part SW421 are connected, so that the first feedback capacitor Cf1 is connected between the first input terminal (−) of the first opamp 421 and the output node ND421. In addition, in the differential global shutter mode period, the control signal VREFSH is fed as a clock to the second switch part SW422 of the amplifying part 420 of the column reading circuit 40.

While these states are maintained, the second pixel signal pixout2 is input into the input part 440, and the second pixel signal pixout2d1, which is one of the differential signals obtained in the global shutter mode, is fed from the first output terminal TO1 of the input part 440 to the first input terminal (−) of the first opamp 421, which is connected to the first sampling capacitor Cs1. In parallel with this, the second pixel signal pixout2d2, which is the other of the differential signals obtained in the global shutter mode, is fed from the second output terminal TO2 of the input part 440 to the second input terminal (+) of the first opamp 421, which is connected to the second sampling capacitor Cs2.

During a predetermined period of time after the read-out luminance signal VSIG and the read-out reset signal VRST are input, the control signal AZ1 and the control signal VREFSH remain at the H level, as shown in the part (E) in FIG. 15. In this way, the autozero switch part SW423 and the switch part SW422 of the amplifying part 420 remain in the conduction state. This resets the first opamp 421 of the amplifying part 420. As a result, the output signal (amplified output) ampout from the first opamp 421 of the amplifying part 420 becomes equal to a predetermined DC potential, for example, the referential potential Vref.

During a predetermined period of time after the control signal AZ1 and the control signal VREFSH are switched to the L level, the control signals SH and AZ2 remain at the H level as shown in the parts (G) and (H) in FIG. 15. In this way, the sample holding switch part SW431 and the autozero switch part SW432 of the AD converting part 430 remain in the conduction state. The lengths of the durations in which the control signals SH and AZ2 remain at the H level decrease in the order of the control signals SH and AZ2. This resets the second opamp 431 of the AD converting part 430.

As a result, the output signal (amplified output) ampout from the first opamp 421 of the amplifying part 420 becomes equal in level to the referential potential Vref, is transferred to the AD converting part 430 through the sample holding switch part SW431 and retained in the third sampling capacitor Cs3 and the fourth sampling capacitor Cs4.

At this point, as shown in the part (J) in FIG. 15, the first search signal Vramp1 having a negative slope waveform is fed to the AD converting part 430 through the search signal input part 432. Then, as shown in the part (K) in FIG. 15, the signal voltage Vcmp, which is obtained by combining together the voltage retained in the fourth sampling capacitor Cs4 and the search signal Vramp1 provided by the search signal input part 432 is fed into the first input terminal (−) of the second opamp 431. In the second opamp 431, comparison is made between the input signal voltage Vcmp, which is input into the first input terminal (−) through the third sampling capacitor Cs3, and the referential potential Vref2, which is fed to the second input terminal (+), and the comparison output signal cmpout at the H level is output as shown in the part (L) in FIG. 15 until the input signal voltage Vcmp crosses the referential potential Vref2. The time duration until the crossing is measured by a counter, which is not shown, so that AD conversion is performed.

Subsequently, the averaged signal AVSR, which is obtained by processing the read-out luminance signal VSIG and the read-out reset signal VRST, is fed to the amplifying part 420. The output signal ampout from the first opamp 4211 is now the signal (Vref+G*(VRST−VSIG)) obtained by amplifying the referential potential Vref by the result of multiplying the difference between the read-out reset signal voltage VRST and the read-out luminance signal VSIG having a lower potential by the capacitance ratio G. The feedback signal ampvst has a potential (Vref+G'*(VRST−VSIG)). During a predetermined period of time after the transfer period ends, as shown in the part (G) in FIG. 15, the control signal SH remains at the H level and the sample holding switch part SW431 of the AD converting part 430 remains in the conduction state. As a result, the output signal (amplified output) ampout from the first opamp 421 of the amplifying part 420 is the signal (Vref+G*(VRST−VSIG)), transferred to the AD converting part 430 through the sample holding switch part SW431 and retained in the fourth sampling capacitor Cs4.

At this point, as shown in the part (J) in FIG. 15, the first search signal Vramp1 having a negative slope waveform is fed to the AD converting part 430 through the search signal input part 432. Then, as shown in the part (K) in FIG. 15, the signal voltage Vcmp, which is obtained by combining together the voltage retained in the fourth sampling capacitor Cs4 and the search signal Vramp1 provided by the search signal input part 432 is fed into the first input terminal (−) of the second opamp 431. In the second opamp 431, comparison is made between the input signal voltage Vcmp, which is input into the first input terminal (−) through the third sampling capacitor Cs3, and the referential potential Vref2, which is fed to the second input terminal (+), and the comparison output signal cmpout at the H level is output as shown in the part (L) in FIG. 15 until the input signal voltage Vcmp crosses the referential potential Vref2. The time duration until the crossing is measured by a counter, which is not shown, so that AD conversion is performed.

Subsequently, the column reading circuit 40, which constitutes part of, for example, the reading part 70, calculates the difference {VRST−VSIG−AVSR} between the read-out reset signal VRST and the read-out luminance signal VSIG and performs digital CDS.

The following describes the CDS processing through the column reading circuit relating to the third embodiment with reference to the parts (A) to (L) in FIG. 15. Referring to the parts (A) to (L) in FIG. 15, an example case is shown where, at the timing t31, the read-out luminance signal VSIG and the read-out reset signal VRST are read concurrently in parallel from the signal retaining part 2128 in the first pixel 21 and input into the first opamp 421 in the column reading circuit 40. Similarly, referring to the parts (A) to (L) in FIG. 15, an example case is shown where, at the timing t32, the averaged signal AVSR and, the read-out luminance signal VSIG and the read-out reset signal VRST are read concurrently in parallel from the signal retaining part 212B in the first pixel 21 and input into the column reading circuit 40.

The following expression represents the input signal Vinp(t31) input into the second input terminal (+) of the first opamp 421 at the timing t31.

$$Vinp(t31)=Vref+(Qinj/(Cs+Cf))\approx Vref \quad \text{[Mathematical Expression 2]}$$

The following expression is given in relation to the input signal Vinn(t31) input into the first input terminal (−) of the first opamp 421 at the timing t31.

$$Cs\times(Vref-Vrst)+Cf\times 0+Qinj=Cs\times(Vref-Vrst)+Cf\times(Vref-Vout) \quad \text{[Mathematical Expression 3]}$$

Accordingly, the following expression represents the output Vout(t31) at the timing t31.

$$Vout(t31)=Vref-Qinj/Cf \quad \text{[Mathematical Expression 4]}$$

The following expression is given in relation to the input signal Vinp(t32) input into the second input terminal (+) of the first opamp 421 at the timing t32.

$$Cs\times(Vref-Vrst)+Cf\times Vref=Cs\times(Vinp-(Vrst+Vsig)/2)+Cf\times Vinp \quad \text{[Mathematical Expression 5]}$$

Accordingly, the following expression represents the input signal Vinp(t32) input into the second input terminal (+) of the first opamp 421 at the timing t32.

$$Vinp(t32)=Vref+(Cs/(Cs+Cf))\times(Vrst-VsiG)/2 \quad \text{[Mathematical Expression 6]}$$

The following expression is given in relation to the input signal Vinn(t31) input into the first input terminal (−) of the first opamp 421 at the timing t32.

$$Cs\times(Vref-Vrst)+Cf\times 0+Qinj=Cs\times(Vinp-(Vrst+Vsig)/2)+Cf\times(Vinp-Vout) \quad \text{[Mathematical Expression 7]}$$

Accordingly, the following expression represents the output Vout(t32) at the timing t32.

$$Vout(t32)=Vref-(Qinj/Cf)+(Cs/Cf)\times(Vrst-Vsig) \quad \text{[Mathematical Expression 8]}$$

Accordingly, the following expression represents the differential output resulting from the digital CDS processing.

$$Vout(t32)-Vout(t31)=(Cs/Cf)\times(Vrst-Vsig) \quad \text{[Mathematical Expression 9]}$$

As described above, subjecting the differential signals to the CDS processing can result in outputting of the difference between the read-out luminance signal VSIG and the read-out reset signal VRST. Although the above-described expressions do not clearly say, subjecting the averaged signal AVSR produced from the read-out luminance signal VSIG and the read-out reset signal VRST to the CDS processing can result in canceling the offsets of the source follower transistors SF3S-Tr, SF3R-Tr.

The following specifically describes an example configuration of the first opamp 421 of the column reading circuit 40.

Figure 16:
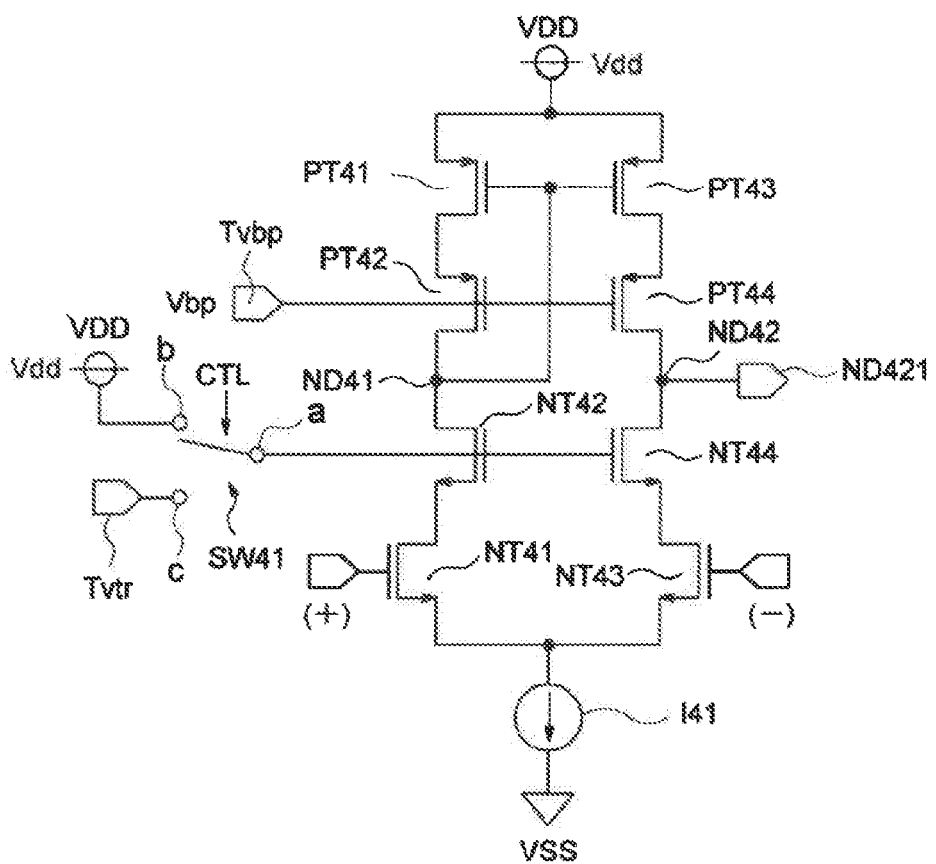
FIG. 16 is a circuit diagram showing an example configuration of a first operational amplifier of the column reading circuit relating to the third embodiment of the present invention.

FIG. 16 is a circuit diagram showing an example configuration of the first opamp of the column reading circuit relating to the third embodiment of the present invention. FIG. 17 illustrates an example of how to control the input range of the first opamp in the differential global shutter mode.

The first opamp 421 can be formed using a high-gain opamp of a source-coupled pair input, which is shown in FIG. 16, for example.

The opamp 421B in FIG. 16 includes PMOS transistors PT41 to PT44, NMOS transistors NT41 to NT44, a switch part SW41, a current source 141, and nodes ND41, ND42.

The PMOS transistors PT41, PT42 and the NMOS transistors NT41, NT42 are cascade-connected between the power supply line Vdd of the power supply voltage VDD and the reference potential VSS, and the PMOS transistors PT43, PT44 and the NMOS transistors NT43, NT44 are cascade-connected between the power supply line Vdd of the power supply voltage VDD and the reference potential VSS. The source of the PMOS transistor PT41 and the source of the PMOS transistor PT43 are connected to each other, and the connection node therebetween is connected to the power supply line Vdd of the power supply voltage VDD. The source of the NMOS transistor NT41 and the source of the NMOS transistor NT43 are connected to each other, and the connection node therebetween is connected to the reference potential VSS and to the current source 141.

The connection point between the drain of the PMOS transistor PT42 and the drain of the NMOS transistor NT42 forms the node ND41, and the connection point between the drain of the PMOS transistor PT44 and the drain of the NMOS transistor NT44 forms the node ND42. The node ND41 is connected to the gates of the PMOS transistors PT41, PT43, and the node ND42 is connected to the output node ND421. The gates of the PMOS transistors PT42, PT44 are both connected to a feeding terminal Tvbp of the bias potential Vbp.

The terminal a of the switch part SW41 is connected to the gates of the NMOS transistors NT42, NT44, the terminal b is connected to the power supply line Vdd of the power supply voltage VDD, and the terminal c is connected to the feeding terminal Tvtr of the telescopic potential Vtr. Referring to the switch part SW41, the conduction state is maintained between the terminal a and the terminal b when, for example, the control signal CTL is at the L level, and the conduction state is maintained between the terminal a and the terminal c when the control signal CTL is at the H level.

When the gain G is set low, the switch part SW41 controls the gates of the NMOS transistors NT42, NT44 to be connected to the power supply line Vdd of the power supply voltage VDD, so that the first opamp 421 is controlled not to function as, so-called, a telescopic amplifier. This is for allowing a wide input range. When the gain G is set high, the switch part SW41 controls the gates of the NMOS transistors NT42, NT44 to be connected to the telescopic potential Vtr, so that the first opamp 421 is controlled to function as, so-called, a telescopic amplifier. This is for reducing gain error.

According to the example shown in FIG. 17, when the gain is low, for example, ×1 or ×2, the gates of the NMOS transistors NT42, NT44 are connected to the power supply line Vdd of the power supply voltage VDD, so that the first opamp 421 is controlled not to function as a telescopic amplifier, since the photon shot noise is dominant over the gain error in the light-incident state. When the gain is high, for example, ×4 or ×8, on the other hand, the gates of the NMOS transistors NT42, NT44 are connected to the telescopic potential Vtr, so that the first opamp 421 is controlled to function as a high-gain telescopic amplifier to reduce the gain error in the light-incident state. since the input range is small.

The third embodiment not only produces the effects of the above-described first and second embodiments but also enables the CDS processing of the differential output signals to be carried out without the need of adding a capacitor or the like to the global shutter pixels of the differential output type, or with keeping the required area small.

Fourth Embodiment

Figure 18:
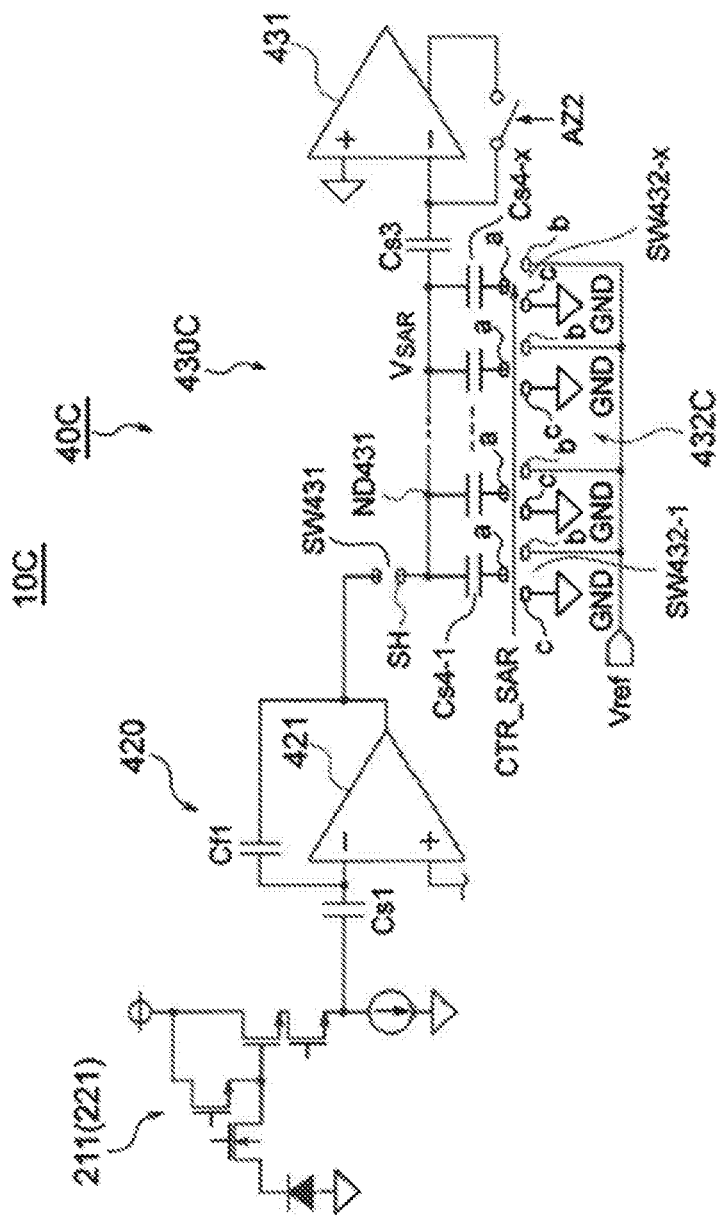
FIG. 18 is a circuit diagram showing an example configuration of a column reading circuit relating to a fourth embodiment of the present invention.
Figure 19:
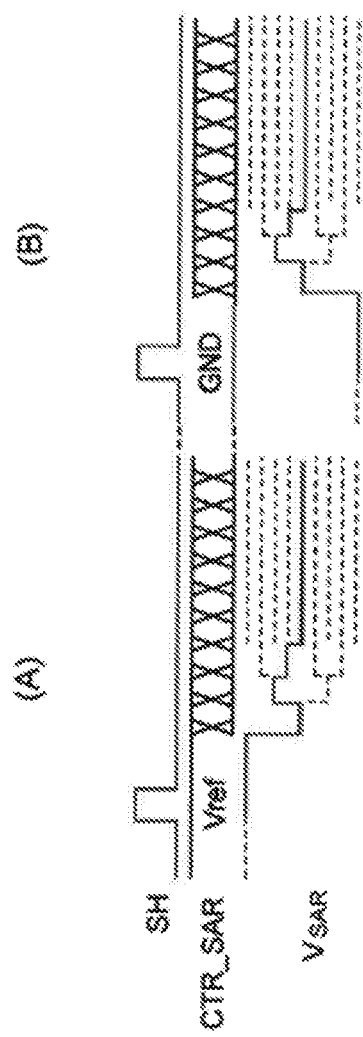
FIG. 19 includes parts (A) and (B) and illustrates an example configuration of a search signal input part compatible with inverted binary search, which is employed in an AD conversion part relating to the fourth embodiment of the present invention.

FIG. 18 is a circuit diagram showing an example configuration of a column reading circuit relating to a fourth embodiment of the present invention. FIG. 19 includes parts (A) and (B) and illustrates an example configuration of a search signal input part compatible with inverted binary search, which is employed in an AD converting part relating to the fourth embodiment of the present invention.

A solid-state imaging device 10C relating to the fourth embodiment differs from the solid-state imaging devices 10, 10A, 10B relating to the above-described first, second and third embodiments in terms of the configuration of a search signal input part 432C of an AD converting part 430C in the column reading circuit 40C.

In the first to third embodiments, the first search signal Vramp1 is fed into the search signal input part 432 as the search signal Vramp when the mode signal fed to the input part is one of the first mode signal MOD1 (the single-ended rolling shutter mode), the third mode signal MOD3 (the differential rolling shutter mode) and the fourth mode signal MOD4 (the differential global shutter mode). In the first to third embodiments, the second search signal Vramp2 is fed into the search signal input part 432 as the search signal Vramp when the mode signal fed to the input part is the second mode signal MOD2 (single-ended global shutter mode). In other words, in the first to third embodiments, the AD converting part 430 employs the first search signal Vramp1 and the second search signal Vramp2, whose levels are inverted with respect to each other.

In the fourth embodiment, on the other hand, the AD converting part 430C is formed as an SAR (successive approximation register) ADC, and the inverted binary search is employed for the feeding of the search signals.

The search signal input part 432C includes a plurality of (x) fourth sampling capacitors Cs4-1 to Cs4-x and a plurality of switch parts SW432-1 to SW432-x. The fourth sampling capacitors Cs4-1 to Cs4-x are connected such that one of the electrodes (terminals) of each fourth sampling capacitor is connected to the input node ND431 of the AD converting part 430C and the other electrode (terminal) of each fourth sampling capacitor is connected to the terminal a of a corresponding one of the switch parts SW432-1 to SW432-x. The terminals b of the switch parts SW432-1 to SW432-x are connected to the referential potential Vref, and the terminals c of the switch parts SW432-1 to SW432-x are connected to the ground GND.

When the first pixel signal pixout1 including the read-out reset signal VRST and the read-out luminance signal VSIG, which are read out in the stated order, is input into the column reading circuit 40C, the switch parts SW432-1 to SW432-x are controlled by the control signal CTR_SAR to be switched between the referential potential Vref and the ground GND in the stated order alternately. Since the switch parts SW432-1 to SW432-x are controlled by the control signal CTR_SAR to be switched between the referential potential Vref and the ground GND in the stated order alternately as described above, the first pixel signal pixout1 including the read-out reset signal VRST and the read-out luminance signal VSIG, which are read out in the stated order, can be AD converted, as shown in the part (A) in FIG. 19.

When the second pixel signal pixout2 including the read-out luminance signal VSIG and the read-out reset signal VRST, which are read out in the stated order, is input into the column reading circuit 40C, the switch parts SW432-1 to SW432-x are controlled by the control signal CTR_SAR to be switched between the ground GND and the referential potential Vref in the stated order alternately. Since the switch parts SW432-1 to SW432-x are controlled by the control signal CTR_SAR to be switched between the ground GND and the referential potential Vref in the stated order alternately as described above, the second pixel signal pixout2 including the read-out luminance signal VSIG and the read-out reset signal VRST, which are read out in the stated order, can be AD converted, as shown in the part (B) in FIG. 19.

The fourth embodiment can produce the same effects as the above-described first, second and third embodiments.

The solid-state imaging devices 10, 10A to 10C described above can be applied, as an imaging device, to electronic apparatuses such as digital cameras, video cameras, mobile terminals, surveillance cameras, and medical endoscope cameras.

Figure 20:
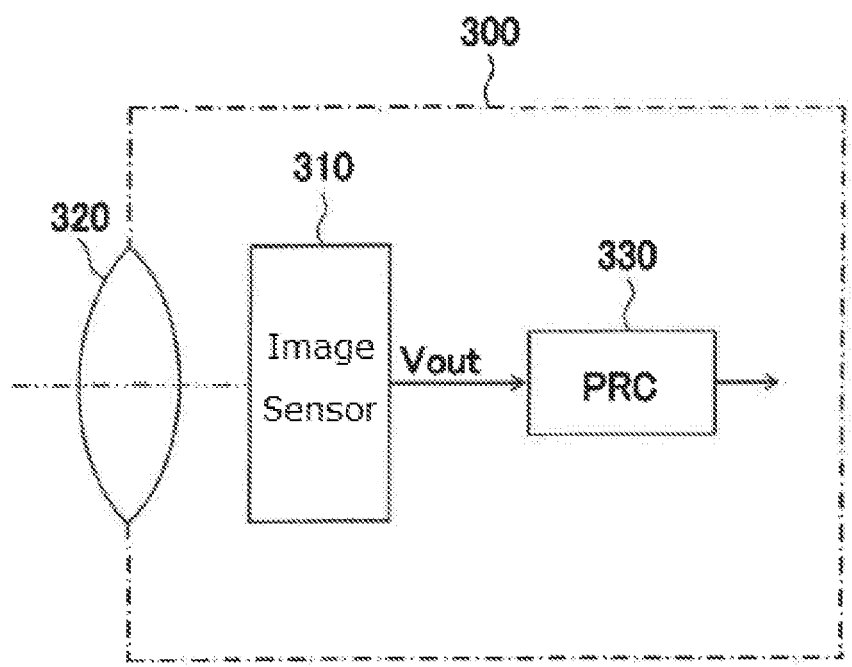
FIG. 20 shows an example configuration of an electronic apparatus to which the solid-state imaging devices relating to the embodiments of the present invention can be applied.

FIG. 20 shows an example of the configuration of an electronic apparatus including a camera system to which the solid-state imaging device according to the embodiments of the present invention is applied.

As shown in FIG. 20, the electronic apparatus 300 includes a CMOS image sensor 310, which can be constituted by any of the solid-state imaging devices 10, 10A to 10C according to the embodiments of the present invention. Further, the electronic apparatus 300 includes an optical system (such as a lens) 320 for guiding the incident light to pixel regions of the CMOS image sensor 310 (forming a subject image). The electronic apparatus 300 includes a signal processing circuit (PRC) 330 for processing the output signals from the CMOS image sensor 310.

The signal processing circuit 330 performs predetermined signal processing on the output signals of the CMOS image sensor 310. The image signals processed in the signal processing circuit 330 can be handled in various manners. For example, the image signals can be displayed as a video image on a monitor having a liquid crystal display, or the image signals can be printed by a printer or recorded directly on a storage medium such as a memory card.

As described above, a high-performance, compact, and low-cost camera system can be provided if any of the solid-state imaging devices 10, 10A to 10C described above is provided as the CMOS image sensor 310. Further, it is possible to produce electronic apparatuses such as surveillance cameras and medical endoscope cameras that are used for applications where cameras are required to be installed under restricted conditions such as the installation size, number of connectable cables, cable length, and installation height.

LIST OF REFERENCE NUMBERS

10, 10A-10C solid-state imaging device
20, 20A, 20B pixel part
PD21, PD22 photodiode
TG1-Tr, TG2-Tr transfer transistor
RST1-Tr, RST2-Tr reset transistor
SF1-Tr, SF2-Tr, SF3-Tr source follower transistor
SEL1-Tr, SEL2-Tr, SEL3-Tr selection transistor
FD21, FD22 floating diffusion
21 first pixel
211 photoelectric conversion reading part
212 signal retaining part
22 second pixel
221 photoelectric conversion reading part
30 vertical scanning circuit
40, 40C reading circuit (column reading circuit)
420 amplifying part
430 AD conversion part
440 input part
50 horizontal scanning circuit
60 timing control circuit
70 reading part
300 electronic apparatus
310 CMOS image sensor
320 optical system
330 signal processing circuit (PRC)

What is claimed is:

1. A solid-state imaging device comprising:
   a pixel part having a pixel arranged therein, the pixel performing photoelectric conversion; and
   a reading circuit having an analog-to-digital conversion function for analog-to-digital converting a pixel signal read out from the pixel to a signal line,
   wherein the pixel signal read out from the pixel is at least either one of:
   a first pixel signal including a read-out reset signal and a read-out luminance signal that are read out in the stated order from the pixel in a first operation; and
   a second pixel signal including a read-out luminance signal and a read-out reset signal that are read out in the stated order from the pixel in a second operation,
   wherein the reading circuit includes:
   an amplifying part for amplifying the pixel signal; and
   an AD converting part for analog-to-digital converting, in connection with a search signal, the pixel signal amplified by the amplifying part, and
   wherein a first search signal for the first pixel signal and a second search signal for the second pixel signal are configurable such that search levels thereof are inverted.

2. The solid-state imaging device according to claim 1, wherein the amplifying part includes:
   a first operational amplifier;
   a first sampling capacitor connected between (i) an input line for the first pixel signal or the second pixel signal and (ii) a first input terminal of the first operational amplifier;
   a first feedback capacitor connected between an output terminal of the first operational amplifier and the first input terminal;
   an offset potential; and
   a first switch part for selectively connecting one of ends of the first feedback capacitor to the output terminal of the first operational amplifier or the offset potential, and
   wherein a second input terminal of the first operational amplifier is connectable at least to a referential potential.

3. The solid-state imaging device according to claim 2, wherein the amplifying part includes:
   a second sampling capacitor connected between (i) an input line for the first pixel signal or the second pixel signal and (ii) a second input terminal of the first operational amplifier;
   a second feedback capacitor connected between the second input terminal of the first operational amplifier and a reference potential; and
   a second switch part for selectively connecting the referential potential to the second input terminal of the first operational amplifier.

4. The solid-state imaging device according to claim 2, wherein the AD converting part includes:
   a second operational amplifier;
   a sample holding switch connected to a signal output line of the amplifying part;
   an input capacitor connected between a first input terminal of the second operational amplifier and the sample holding switch; and
   a search signal input part connected between (i) a connection terminal of the input capacitor that is connected to the sample holding switch and (ii) a feeding line of the search signal, the search signal input part inputting the search signal into the connection terminal of the input capacitor that is connected to the sample holding switch, and
   wherein a second input terminal of the second operational amplifier is connected to the referential potential.

5. The solid-state imaging device according to claim 4, wherein the search signal input part of the AD converting part includes:
   a search signal input capacitor connected at one of terminals thereof to the connection terminal of the input capacitor that is connected to the sample holding switch and at the other terminal thereof to the feeding line of the search signal.

6. The solid-state imaging device according to claim 4, wherein the search signal input part of the AD converting part includes:
a plurality of capacitors each of which is connected at one of terminals thereof to the connection terminal of the input capacitor that is connected to the sample holding switch; and
a plurality of switches arranged in correspondence with the plurality of capacitors, each of the switches selectively connecting the other terminal of a corresponding one of the capacitors to a referential or reference potential in accordance with a control signal complying with binary search.

7. The solid-state imaging device according to claim 4, wherein the amplifying part includes:
a first autozero switch connected between the first input terminal of the first operational amplifier and an output terminal of the first operational amplifier, and
wherein the AD converting part includes:
a second autozero switch connected between the first input terminal of the second operational amplifier and an output terminal of the second operational amplifier.

8. The solid-state imaging device according to claim 2, wherein when the first pixel signal is a single-ended signal and input into the first sampling capacitor of the amplifying part,
the first feedback capacitor of the amplifying part is connected to the output terminal of the first operational amplifier by the first switch part, and the second input terminal of the first operational amplifier is connected to the referential potential, and
the first search signal is fed to the AD converting part, and
when the second pixel signal is a single-ended signal and input into the first sampling capacitor of the amplifying part,
the first feedback capacitor of the amplifying part is selectively connected to the offset potential by the first switch part, and the second input terminal of the first operational amplifier is connected to the referential potential, and
the second search signal that is obtained by inverting a search level of the first search signal is fed to the AD converting part.

9. The solid-state imaging device according to claim 2, wherein when the first pixel signal is a differential signal and input into the first sampling capacitor and a second sampling capacitor of the amplifying part,
the first feedback capacitor of the amplifying part is connected to the output terminal of the first operational amplifier by the first switch part, and
the first search signal is fed to the AD converting part.

10. The solid-state imaging device according to claim 2, wherein when the second pixel signal is a differential signal and input into the first sampling capacitor and a second sampling capacitor of the amplifying part,
the first feedback capacitor of the amplifying part is connected to the output terminal of the first operational amplifier by the first switch part, and
the first search signal is fed to the AD converting part.

11. The solid-state imaging device according to claim 1, comprising:
the pixel part having, from among a first pixel and a second pixel, at least the first pixel arranged therein, the first pixel including a photoelectric conversion reading part and a signal retaining part, and the second pixel including the photoelectric conversion reading part;
a reading part for reading pixel signals from the pixel part;
a first signal line to which a read-out signal from the photoelectric conversion reading part is output; and
a second signal line to which a retaining signal from the signal retaining part is output,
wherein at least the photoelectric conversion reading part of the first pixel includes:
an output node;
a photoelectric conversion element for storing therein, in a storage period, charges generated by photoelectric conversion;
a transfer element for transferring, in a transfer period, the charges stored in the photoelectric conversion element;
a floating diffusion to which the charges stored in the photoelectric conversion element are transferred through the transfer element;
a source follower element for converting the charges in the floating diffusion into a voltage signal at a level corresponding to the quantity of the charges and outputting the voltage signal to the output node;
a reset element for resetting, in a reset period, the floating diffusion to a predetermined potential; and
a selection element for electrically connecting in a first period, the output node to the first signal line, and
wherein the signal retaining part includes:
a sample-and-hold capacitor for retaining therein a signal output from the output node of the photoelectric conversion reading part of the first pixel;
a switch element for selectively connecting, in a second period, the sample-and-hold capacitor to the output node of the photoelectric conversion reading part; and
an output part including a source follower element for outputting, in the second period, the signal retained in the sample-and-hold capacitor at a level corresponding to a retained voltage, the output part selectively outputting a signal obtained by conversion to the second signal line.

12. The solid-state imaging device according to claim 11, wherein the pixel part at least includes:
a first pixel array in which the photoelectric conversion reading parts of a plurality of the first pixels are arranged in a matrix pattern; and
a retaining part array in which the signal retaining parts of the plurality of first pixels are arranged in a matrix pattern.

13. The solid-state imaging device according to claim 12, wherein the pixel part includes:
a second pixel array in which the photoelectric conversion reading parts of a plurality of the second pixels are arranged in a matrix pattern, and
wherein the photoelectric conversion reading parts of the plurality of second pixels each include:
a photoelectric conversion element for storing therein, in a storage period, charges generated by photoelectric conversion;
a transfer element for transferring, in a transfer period, the charges stored in the photoelectric conversion element;
a floating diffusion to which the charges stored in the photoelectric conversion element are transferred through the transfer element;
a source follower element for converting the charges in the floating diffusion into a voltage signal at a level corresponding to the quantity of the charges;
a reset element for resetting, in a reset period, the floating diffusion to a predetermined potential; and
a selection element for electrically connecting, in a first period, an output line of a voltage signal fed from the source follower element to the first signal line.

14. The solid-state imaging device according to claim 11, wherein, in a first operation, the reading part reads the pixel signals with the first pixel array of the first pixels and the second pixel array of the second pixels being activated.

15. The solid-state imaging device according to claim 11, wherein, in a second operation, the reading part reads the pixel signals with the selection elements in the photoelectric conversion reading parts in the first and second pixels being in a non-selected state and with the first pixel array of the first pixels and the retaining part array being activated.

16. The solid-state imaging device according to claim 11 comprising:
a first substrate; and
a second substrate,
wherein the first substrate and the second substrate have a stacked structure in which the first substrate and the second substrate are connected through a connection part,
wherein the first substrate includes at least the photoelectric conversion reading part of the first pixel and the first signal line formed therein, and
wherein the second substrate includes at least the signal retaining part of the first pixel, the second signal line, and at least a portion of the reading part formed therein.

17. A method for driving a solid-state imaging device, the solid-state imaging device including:
a pixel part having a pixel arranged therein, the pixel performing photoelectric conversion; and
a reading circuit having an analog-to-digital conversion function for analog-to-digital converting a pixel signal read out from the pixel to a signal line,
wherein the reading circuit includes:
an amplifying part for amplifying the pixel signal; and
an AD converting part for analog-to-digital converting, in connection with a search signal, the pixel signal amplified by the amplifying part, and
wherein the pixel signal read out from the pixel is at least either one of:
a first pixel signal including a read-out reset signal and a read-out luminance signal that are read out in the stated order from the pixel in a first operation; and
a second pixel signal including a read-out luminance signal and a read-out reset signal that are read out in the stated order from the pixel in a second operation, and
wherein the search signal fed to the reading circuit is configured such that a first search signal for the first pixel signal and a second search signal for the second pixel signal are configurable such that search levels thereof are inverted.

18. An electronic apparatus comprising:
a solid-state imaging device; and
an optical system for forming a subject image on the solid-state imaging device,
wherein the solid-state imaging device includes:
a pixel part having a pixel arranged therein, the pixel performing photoelectric conversion; and
a reading circuit having an analog-to-digital conversion function for analog-to-digital converting a pixel signal read out from the pixel to a signal line,
wherein the pixel signal read out from the pixel is at least either one of:
a first pixel signal including a read-out reset signal and a read-out luminance signal that are read out in the stated order from the pixel in a first operation; and
a second pixel signal including a read-out luminance signal and a read-out reset signal that are read out in the stated order from the pixel in a second operation,
wherein the reading circuit includes:
an amplifying part for amplifying the pixel signal; and
an AD converting part for analog-to-digital converting, in connection with a search signal, the pixel signal amplified by the amplifying part, and
wherein a first search signal for the first pixel signal and a second search signal for the second pixel signal are configurable such that search levels thereof are inverted.

* * * * *